United States Patent [19]
George

[11] Patent Number: 5,669,133
[45] Date of Patent: Sep. 23, 1997

[54] METHOD OF MAKING A MAGNETORESISTIVE SENSOR

[75] Inventor: Peter Kurt George, Bloomington, Minn.

[73] Assignee: Seagate Technology, Inc., Scotts Valley, Calif.

[21] Appl. No.: 563,563

[22] Filed: Nov. 28, 1995

Related U.S. Application Data

[63] Continuation of Ser. No. 214,689, Mar. 17, 1994, abandoned, which is a continuation-in-part of Ser. No. 936,185, Aug. 25, 1992, abandoned.

[51] Int. Cl.$^6$ .................................. G11B 5/127; G11B 5/39
[52] U.S. Cl. ........................ 29/603.16; 29/603.15; 29/603.18; 360/113
[58] Field of Search ................... 29/603.13–603.18, 29/607, 608, 609; 216/88; 324/252; 360/113; 427/130

[56] References Cited

U.S. PATENT DOCUMENTS

| | | | |
|---|---|---|---|
| 4,503,394 | 3/1985 | Kawakami et al. | 324/252 |
| 4,843,505 | 6/1989 | Mowry | 360/113 |
| 4,967,298 | 10/1990 | Mowry | 360/113 |
| 5,018,037 | 5/1991 | Krounbi et al. | 360/113 |
| 5,079,035 | 1/1992 | Krounbi et al. | 427/130 |
| 5,285,339 | 2/1994 | Chen et al. | 360/113 |

*Primary Examiner*—Peter Vo
*Attorney, Agent, or Firm*—Westman, Champlin & Kelly, P.A.

[57] ABSTRACT

A magnetoresistive sensor having an improved read sensitivity function which remains relatively stable in response to variations in lapping. The magnetoresistive sensor includes a magnetoresistive element, a first electrical contact and a second electrical contact. During lapping, the boundaries between the electrical contacts and the magnetoresistive element, and therefore the active region of the magnetoresistive element, remain relatively constant in a lateral direction across the magnetoresistive sensor. This provides a relatively insensitive read sensitivity function within a predetermined lapping tolerance range.

26 Claims, 19 Drawing Sheets

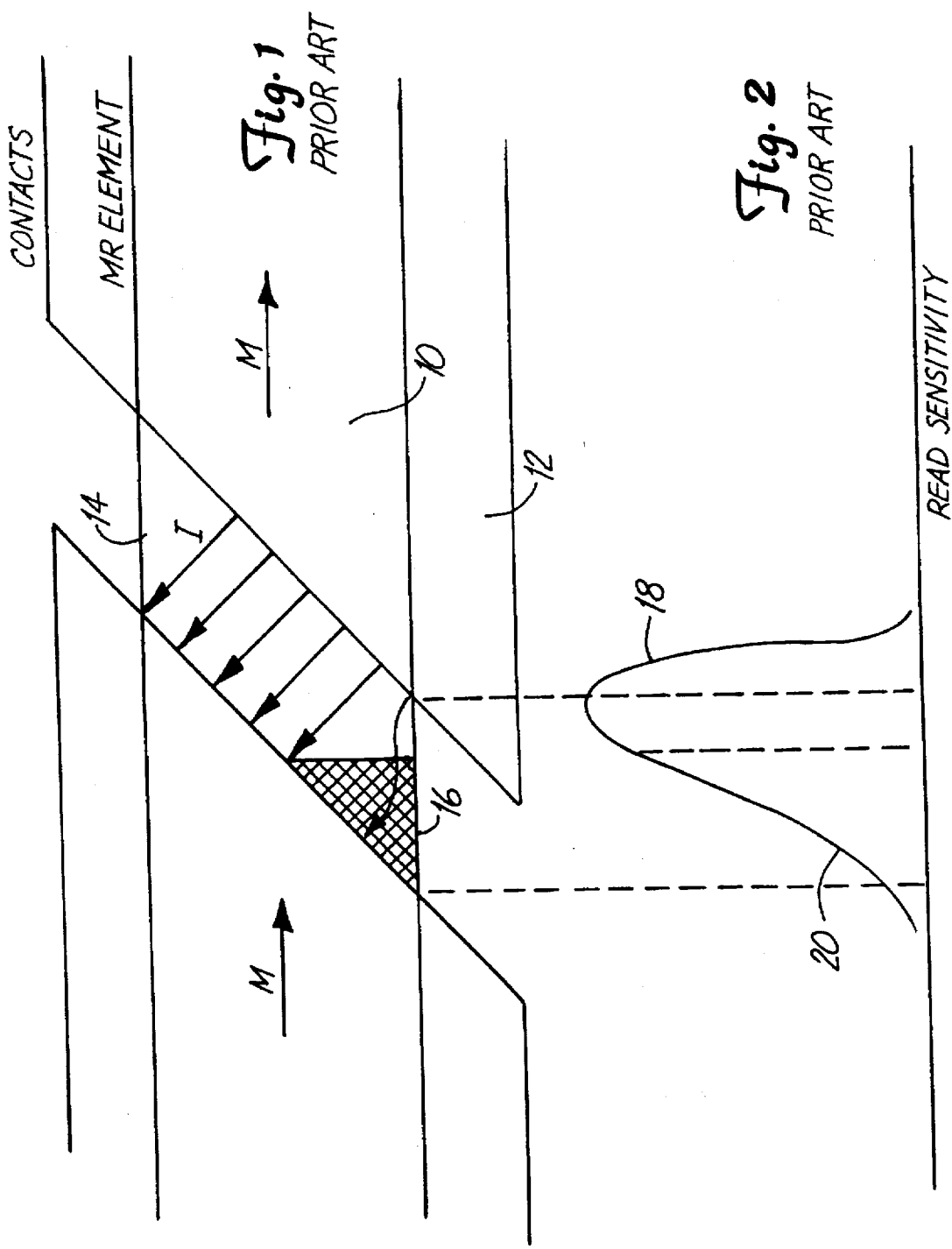

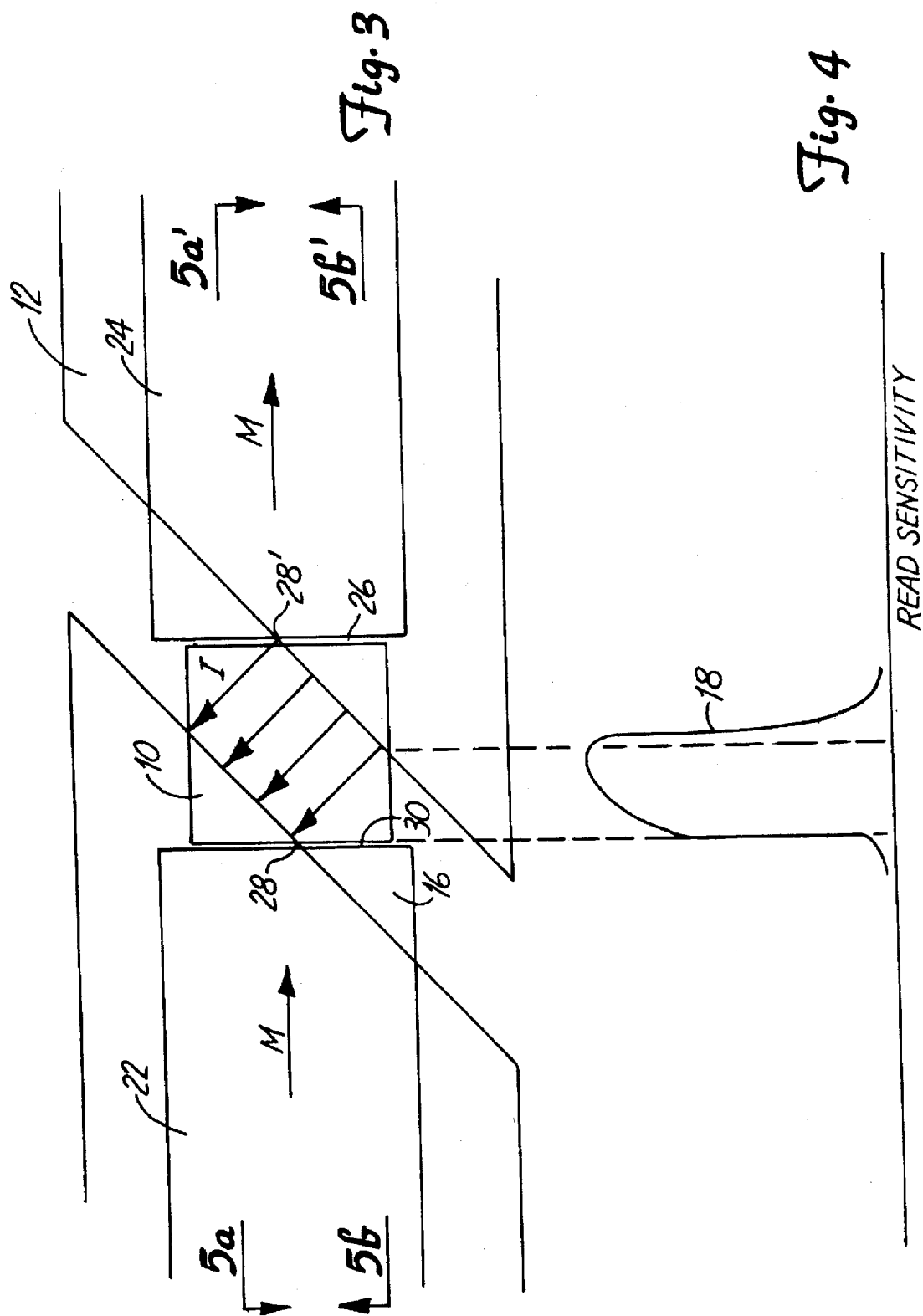

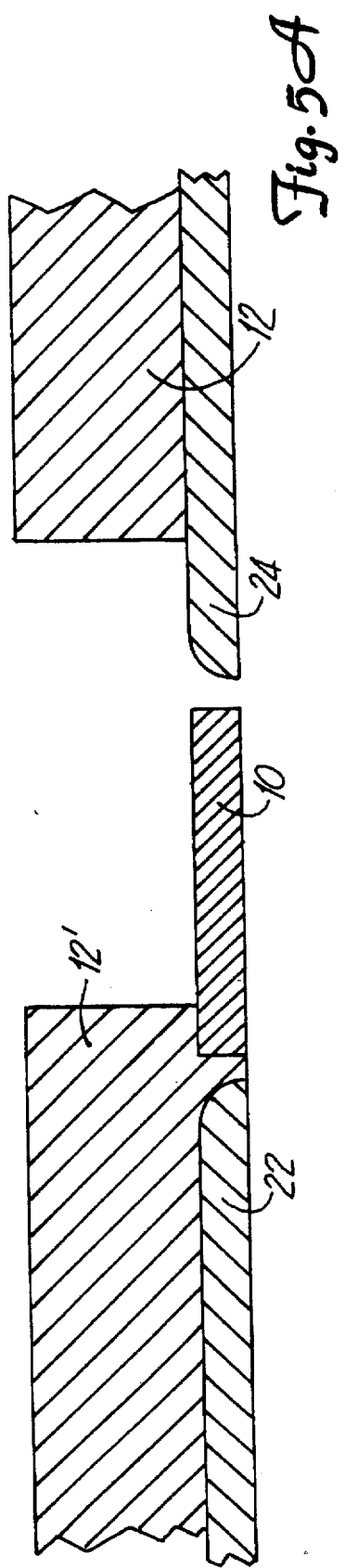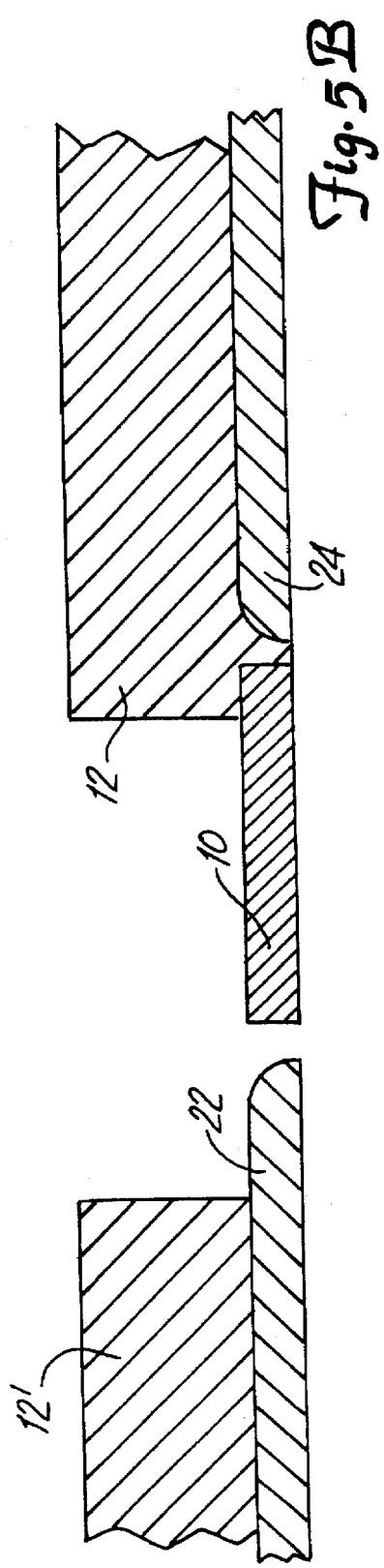

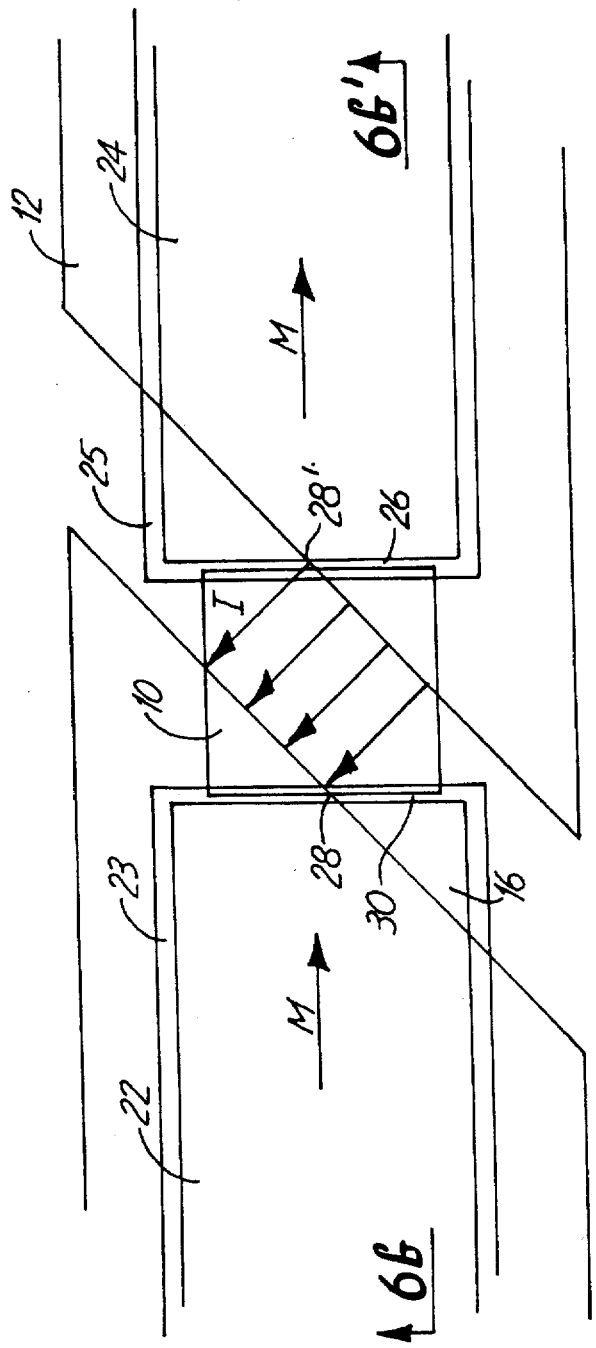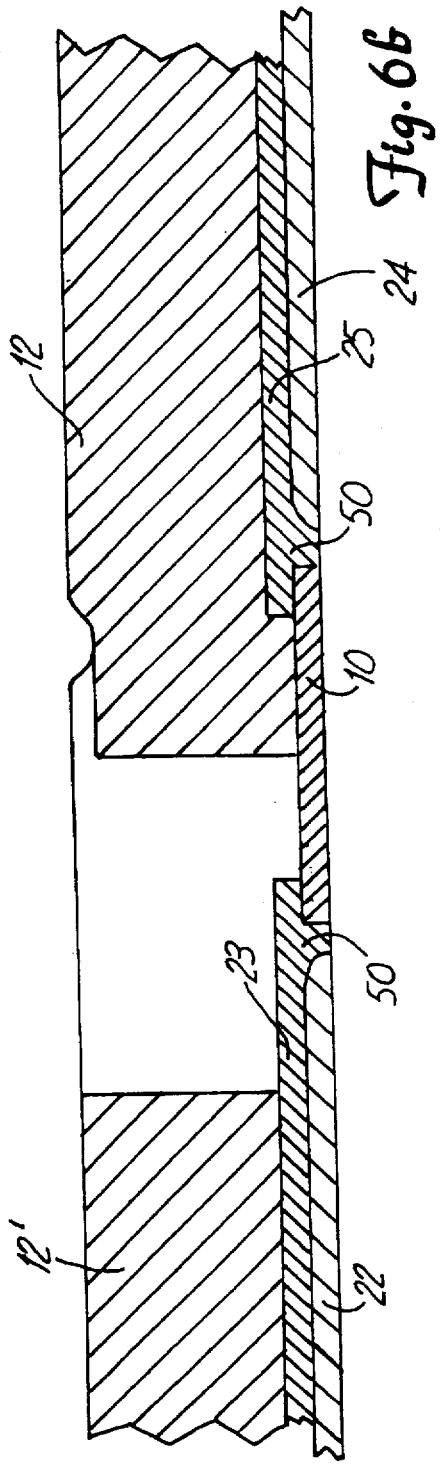

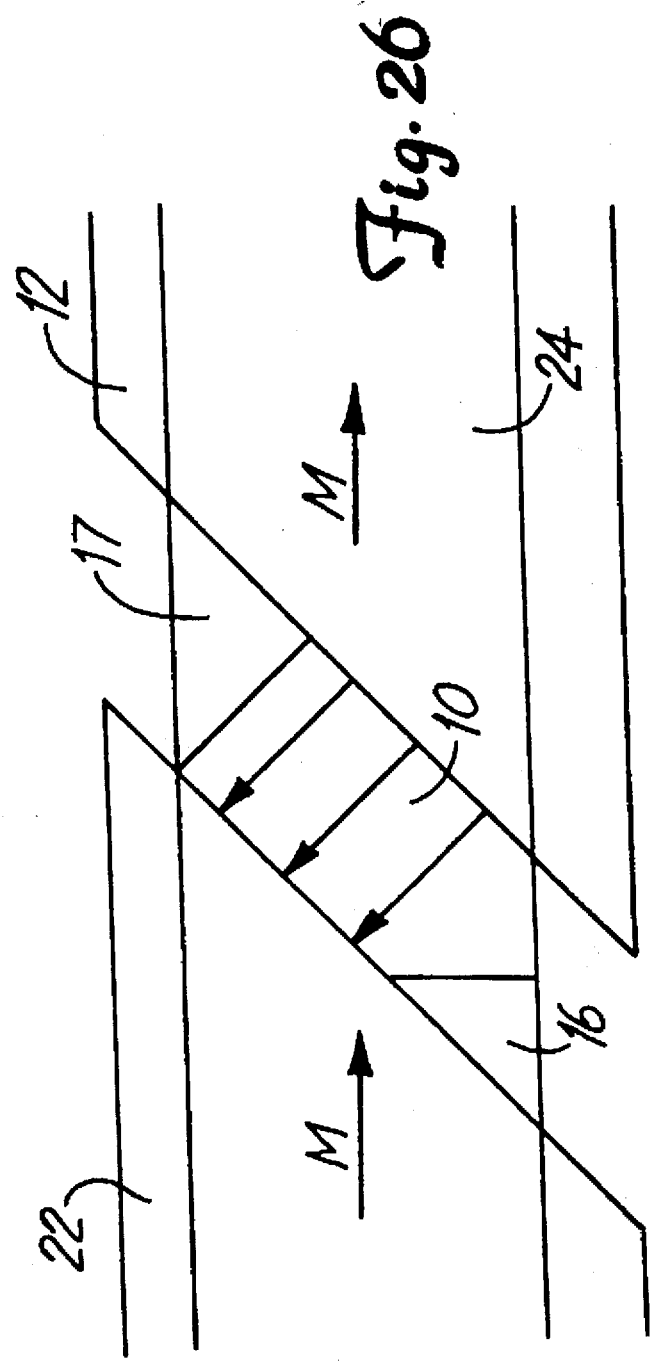

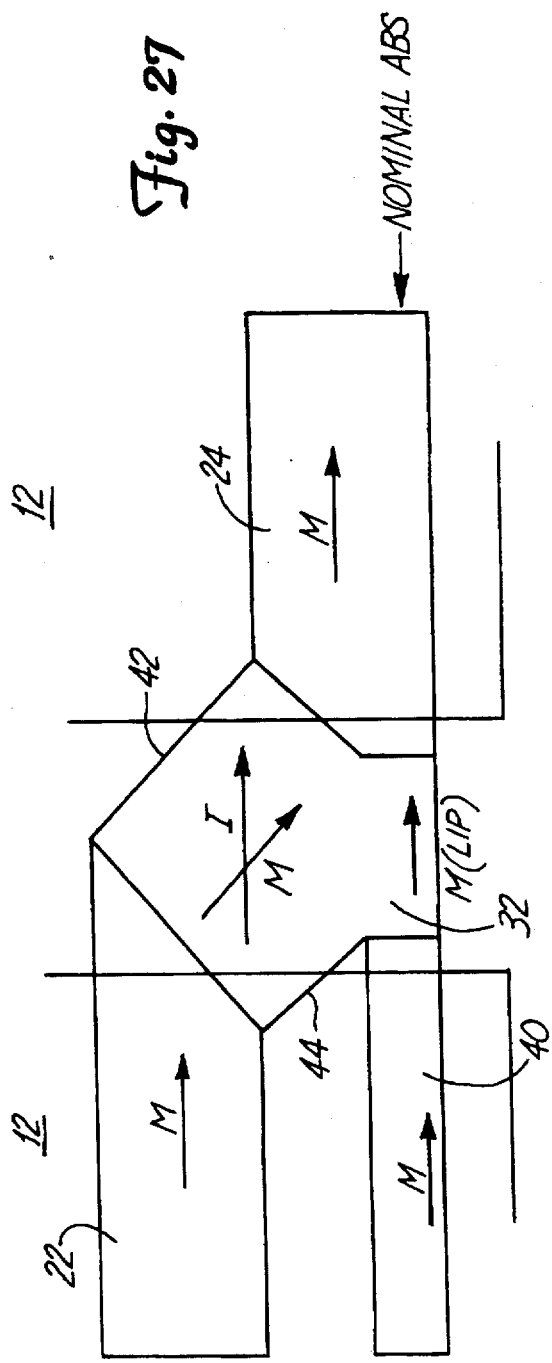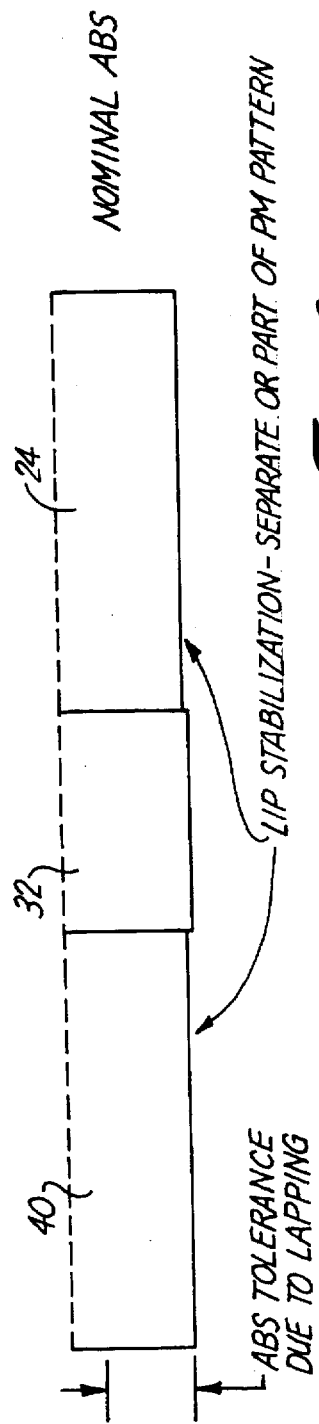

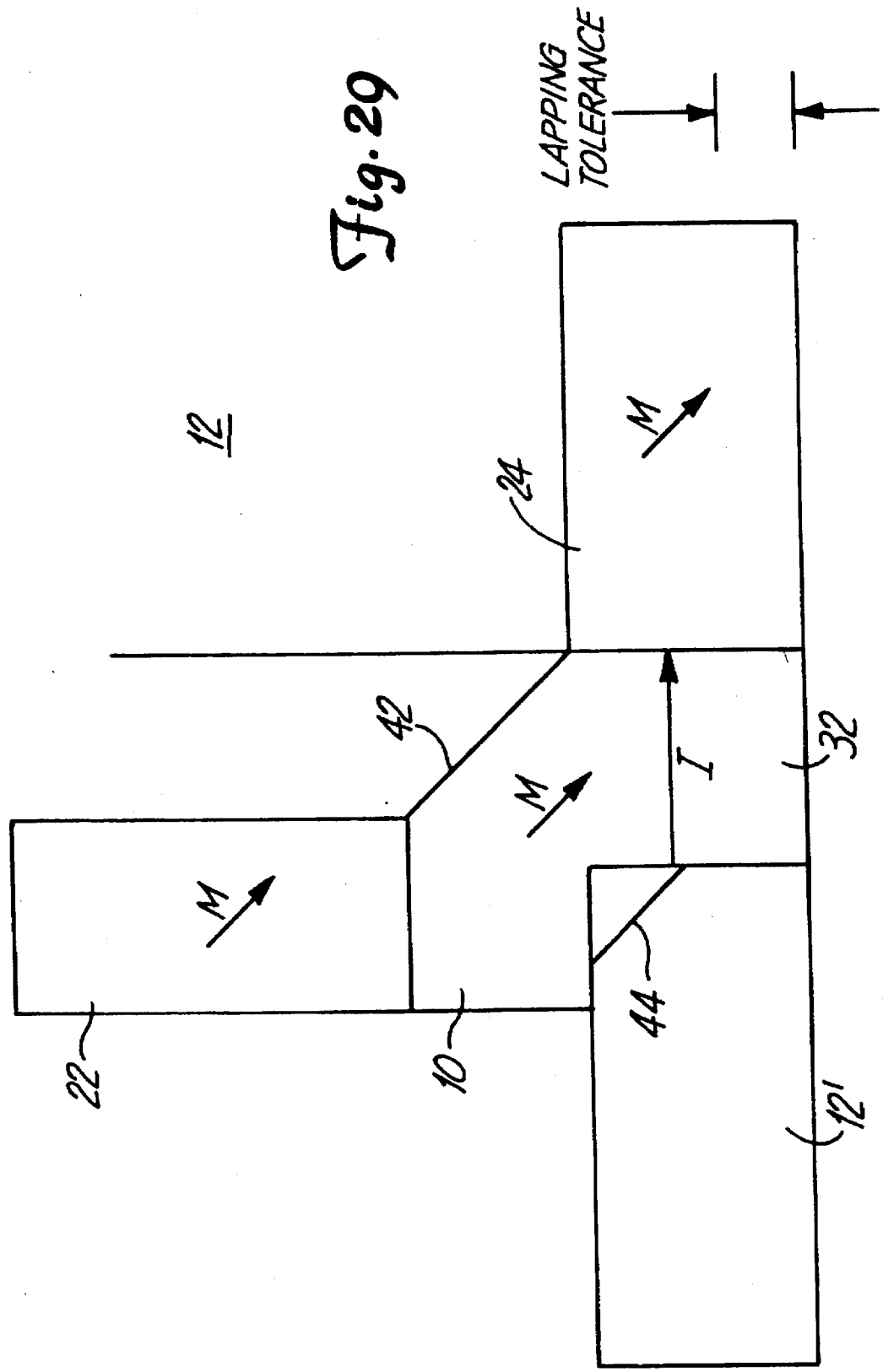

METHOD OF MAKING A MAGNETORESISTIVE SENSOR

REFERENCE TO CO-PENDING APPLICATION

This is a continuation of application Ser. No. 08/214,689, filed Mar. 17, 1994 now abandoned. Priority of the prior application is claimed pursuant to 35 USC §120.

The present application is a Continuation-In-Part of co-pending application Ser. No. 07/936,185, filed Aug. 25, 1992, now abandoned, entitled "IMPROVED READ SENSITIVITY MR HEAD USING PERMANENT MAGNET LONGITUDINAL STABILIZATION" having common assignment.

BACKGROUND OF THE INVENTION

The invention relates to magnetic recording disk drives and, more particularly, to magnetoresistive heads therefor. More specifically, the invention relates to electrical contacts to reduce lapping sensitivity of a magnetoresistive sensor.

Magnetoresistive (MR) heads of the canted-current type, derived from a head type known as a barber pole MR head, exhibit a skewed read sensitivity function primarily due to the variation in distance of the contact edges from the input surface (the sensor's output is proportional to this distance), particularly the narrow corners between the contacts and the MR element. The problem is illustrated in FIG. 1, where the MR element 10 extends left to right in the figure and the contacts 12 are canted across the sensor at approximately 45°, creating a sense region where current I primarily flows (perpendicular to the contact edges) across the sense region at approximately 45° relative to the MR element's magnetization vector M. However, in the cross-hatched triangular region 16, current flows at a shallower angle more parallel with the MR element's magnetization vector than it is in the center of the sense region. Because of magnetization rotation and the presence of sense current in this region, detection is still possible. As a result, the read sensitivity extends farther to the left than to the right thus producing a skewed read sensitivity function.

The read sensitivity function we discuss herein is the sensitivity of the sensor vs. location across the sensor for a microtrack of recorded information less than one micrometer in width. In FIG. 1, the media disc surface is adjacent the lower edges of contacts 12, and the magnetization vector M is transverse the direction of rotation. Accordingly, one contact 12 will be closer to the inner radius of the media disc and the other contact 12 will be close to the outer radius of the media disc. The read sensitivity function for the MR sensor illustrated in FIG. 1 is shown in FIG. 2 as line 18. Due to the presence of the current vector I and the MR element's magnetization vector M in the cross-hatched region 16, the read sensitivity function 18 is asymmetric and exhibits a substantially large tail 20 extending to the left in the figure.

There are two problems when using such an asymmetric MR sensor in an application such as a magnetic disk drive in which the MR sensor may be required to read both data and servo information from very narrow tracks on a magnetic disk surface. The first problem is noise and cross-talk because of the excessively long tail on the read sensitivity function. The second is the use of the sensor to read analog servo data. Due to the asymmetrical nature of the read sensitivity function, the response to servo data from left and right are not equivalent—thus requiring special compensation to make this application practical.

SUMMARY OF THE INVENTION

The invention includes patterning the electrical contacts so as to substantially reduce the undesired "read sensitivity" function which arises due to misalignment between the electrical contacts and the magnetoresistive element.

First and second electrical contacts couple to the magnetoresistive element in a magnetoresistive sensor. The magnetoresistive sensor includes an air bearing surface extending in a lateral direction. The first electrical contact is spaced apart in a vertical direction (which is perpendicular to the lateral direction) from the air bearing surface and couples to the magnetoresistive element. The first electrical contact includes an inner lateral edge extending in the lateral direction and a current directing edge. The second electrical contact couples to the magnetoresistive element and includes an outer lateral edge which is flush with the air bearing surface and extends in the lateral direction. The second electrode includes a vertical edge closest to the first electrode and extending in the vertical direction.

Following formation of the above contacts and magnetoresistive element, the air bearing surface is lapped to desired dimensions to improve sensitivity of the magnetoresistive sensor. During the lapping process, the vertical edge of the second electrical contact remains stationary relative to the magnetoresistive element and the first electrical contact.

In one embodiment, the outer lateral edge and the vertical edge of the second contact form an angle of about 90°. In another embodiment, the inner lateral edge and the current directing edge of the first contact form an angle of about 90°. In another embodiment, this angle is about 135°. In another embodiment, the inner lateral edge and the current directing edge of the second contact form an angle of about 90°. In another embodiment, this angle is about 135°.

BRIEF DESCRIPTION OF THE DRAWINGS

FIG. 1 is a plan view diagram of the essential layers of a conventional, canted-current MR sensor.

FIG. 2 shows the read sensitivity function for the sensor of FIG. 1.

FIG. 3 is a diagram of a magnetoresistive sensor according to a preferred embodiment of the present invention.

FIG. 4 shows the read sensitivity function of the sensor of FIG. 3.

FIG. 5a and 5b are cross sections along 5a–5a' and 5b–5b of FIG. 3.

FIG. 6a is a diagram of an alternative magnetoresistive sensor having an optional insulator layer.

FIG. 6b is a cross section along 6b–6b' of FIG. 6a.

FIG. 26 is a variation on the preferred embodiment in which the inefficient portions of the MR element are removed.

FIG. 27 is a diagram of an alternative construction of an MR element in which the at-rest magnetization vector of the MR element is rotated and wherein the rotated sensor is also provided with a lip separately stabilized.

FIG. 28 is a diagram of a generalized configuration of the lip stabilization for the sensor of FIG. 11 that may be applied to any design.

FIG. 29 is a diagram of an embodiment providing for a rotated, at-rest magnetization squared-off contacts, and a lip, in which the read sensitivity function is relatively tolerant to lapping.

DETAILED DESCRIPTION OF THE PREFERRED EMBODIMENTS

Figure 7A:
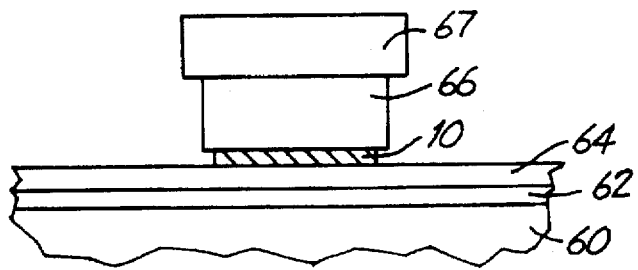
FIGS. 7a–d illustrate a preferred method for forming the alternative embodiment of FIGS. 6a and 6b.

FIG. 3 is a diagram of one embodiment of the present invention. The figure shows a canted-current configured magnetoresistive sensor in which the current contacts 12 are substantially canted across the MR element while the magnetization vector M of the element is aligned along the width of the sensor. In the figure, the MR element is defined as a substantially square element 10, centered between the gap in current contacts 12. The ends of the MR element are stabilized by permanent magnetic layers 22 and 24. The permanent magnetic layers 22 and 24 abut the ends of the square MR element, but are separated therefrom by small gaps 26. The sense current contacts 12 overlay these layers and have edges which cross the MRE at approximately 45° to M, with the distance between the contacts chosen such that the points 28 and 28' where the respective contacts 12 cross the gaps 26 lie close to the horizontal center of the MR element.

In this configuration, the sense current I flows between the contacts 12 substantially only in a central region defined between these two intersections, 28 and 28', and does not flow through the undesired region 16 due to gaps 26. The elongated tail in the read sensitivity function on the left is therefore eliminated.

Because the effective sense current is confined as above described, the read sensitivity function is substantially symmetrical and "squared up" as illustrated in FIG. 4. The output from region 16 is eliminated, cutting off the troublesome tail 20 in FIG. 2.

Turning to FIGS. 5a and 5b, which are partial cross-sections along 5a–5a' and 5b–5b' in FIG. 3, the permanent magnetic layers 22 and 24 are shown in combination with magnetoresistive layer 10 and metallic current contacts 12. Due to the requirement to control the magnetic boundary conditions between the permanent layers 22 and 24 in the magnetoresistive layer 10, which will be discussed subsequently, the magnetoresistive layer 10 will typically be substantially the same thickness as the permanent magnetic layers 22 and 24. Conventionally, the magnetoresistive layer will be on the order of 300 angstroms thick. As illustrated in the figure, the preferred permanent magnetic layers 22 and 24 will also be on the order of 300 angstroms thick. As well known in the art, the metallic current contacts 12 can be made substantially thicker than either the permanent magnetic or magnetoresistive layers. In the figure, the contacts 12 are preferably on the order of 1000 angstroms thick.

While the preferred embodiment has a small gap between permanent magnet and magnetoresistive layer, this is not necessary if the permanent magnet layer's resistivity is chosen such that it is much higher than that of the MR layer. With such a configuration, the sensor may be formed using methods such as disclosed in U.S. Pat. No. 5,079,035, which is hereby incorporated by reference as if fully set forth herein. See also U.S. Pat. No. 5,018,037. A preferred method for forming a gap between the layers will be discussed in relation to FIGS. 7a–d.

In the preferred embodiment, the magnetoresistive element is preferably composed of the alloy $Ni_{82} Fe_{18}$ (permalloy). The permanent magnetic layers are preferably one of the following (or similar) alloys: $Co_{78} Pt_{22}$; $CO_{78} Cr_8 Pt_{14}$; or $Co_{80} Sm_{20}$. The contacts layers are preferably composed of a trilayer of Mo—Au—Mo, but many other conducting metals may be used.

A single-domain MR element having edges at which magnetization M is directed other than parallel to the edge will exhibit a net external magnetic field at the edges which may cause the element to become unstable. These edge regions can then "fracture" into multiple domains with the net internal field of one domain canceling the net internal field of adjacent domains so that the entire element may exhibit no external field.

In order to maintain such an element in a single domain state, various techniques may be employed, one of which is to apply an external magnetic field in order to keep magnetic dipoles of the crystalline alloy aligned in the preferred direction. This has been known in the past as "longitudinal biasing." See e.g., U.S. Pat. No. 4,967,298 for a discussion of the single domain problem and its previously known solutions.

The proper amount of permanent magnetic layer is sufficient to produce the same magnetic flux as that of the saturated MR element layer at the boundary of the MR element. Exceeding this amount of flux—although it also serves to keep the MR element in a single domain state— will act to decrease the sensitivity of the MR element to (transverse) input flux.

Because the length of contact (into the figure) between the layers at their abutting end regions are equal, the flux matching requirement can be expressed as $$M_r(PM)*t(PM)=M_r(MR)*t(MR),$$

where $M_r$ is the at-rest magnetization, "PM" is an abbreviation for "permanent magnet," and "t" is the thickness of the respective layers. Because the $M_r$ of typical permanent magnetic materials to be used in the present application is approximately equal to that of the MR materials, the permanent magnetic layer will be approximately as thick as the MR layer. For permalloy which typically has a square loop, $M_r$ is close to the saturation value $M_s$ thus insuring single domain behavior.

With the permanent magnetic layer thickness thus chosen, not only are demagnetizing fields in the MR element layer controlled, but there is little or no "excess" longitudinal magnetic field in the central active region of the MR element which will interfere with sensor performance.

Returning to FIG. 3 for a moment, it was above noted that in some configurations, current could flow in the undesired region 16. This current will not affect the read sensitivity function because the material located in the undesired region does not exhibit a magnetoresistive response. However, any current flowing in this area detracts from the current that could flow in the sense region and is therefore undesirable from the efficiency standpoint.

A further improvement to enhance the electrical isolation of the permanent magnet layers is illustrated in FIGS. 6a and 6b. In these figures, a small amount of electrically insulating material 23,25 has been interposed between the permanent magnetic layer 22,24 and the MR element 10. This "spacer" 50 is preferably formed of an oxide such as $Al_2O_3$.

This spacer 50 effectively electrically isolates the MR layer and the current carrying contacts from the permanent magnetic layer while also permitting the magnetic flux coupling required to hold the MR layer in a single-domain state. Use of the spacer will substantially confine all sense current to only those portions of the MR element for which the read sensitivity function is nearly symmetrical.

The structure shown in FIGS. 6a and 6b may be formed by using a process such as illustrated in FIGS. 7a–d.

Referring first to FIG. 7a, the conventional MR head is formed upon a substrate comprising a base coat 60, a soft magnetic shield, 62, and a half-gap layer 64, conventionally composed of aluminum oxide. The MR element 10 of the present invention is deposited and patterned upon this oxide layer 64 by using a special bi-layer lift off resist which has an upper section 67 broader than the lower section 66. (A single layer resist may also be used in an alternative approach.) In the inventive process, the MR element is over etched using a chemical etchant such that the resulting MR element has a width slightly less than the overlying resistive structure.

Figure 7B:
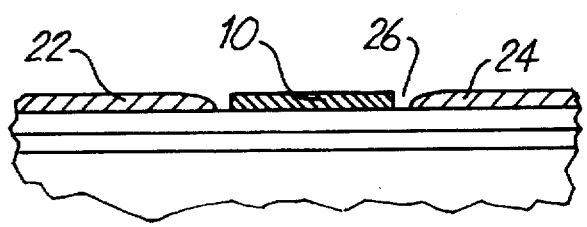

Referring to FIG. 7b, the permanent magnetic layers are now sputter deposited using these resistive layers as a mask. This results in a structure, such as illustrated in FIG. 7b, where the permanent magnetic layers 22 and 24 are separated from the MR element 10 by small gaps 26.

After the deposition of the permanent magnetic layers, the resist is removed by a lift off process. Thereafter, an electrical insulator layer 27 is deposited over the whole sensor. See FIG. 7c. This electrical insulator layer could be aluminum oxide, such as $Al_2O_3$. Next another layer 68 of resist is deposited over the insulator and patterned to expose 70 most of the MR layer 10, leaving small areas along the edge of the MR element covered by the resist. Using this resist mask 68, the insulator 27 is removed from over the MR sensor with an appropriate process such as selective chemical etching or ion milling to thereby expose the MR layer in this central gap region 70.

Figure 7C:
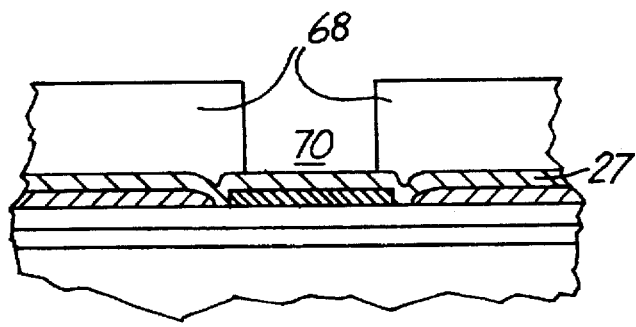
Figure 7D:
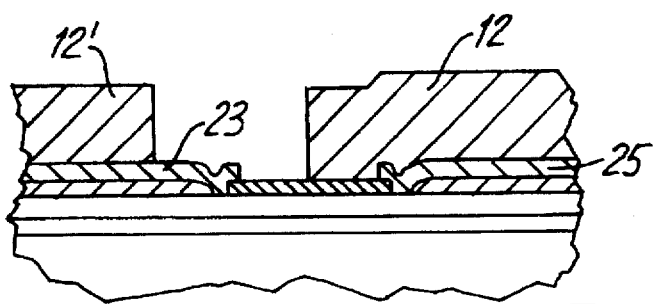

Thereafter, the resist 68 is stripped and the contacts 12 and 12' are deposited and patterned using conventional processes, resulting in the structure shown in FIG. 7d, which is substantially the same as the structure shown in FIG. 6b.

If one employs standard chemical techniques to remove photoresist, the bi-layer resist 66–67 of FIG. 7a may be replaced by a conventional single-layer resist.

Further, the process shown in FIGS. 7a–d can be modified to produce the sensor structure of FIG. 3 by skipping the steps illustrated in FIG. 7c.

Figure 8:
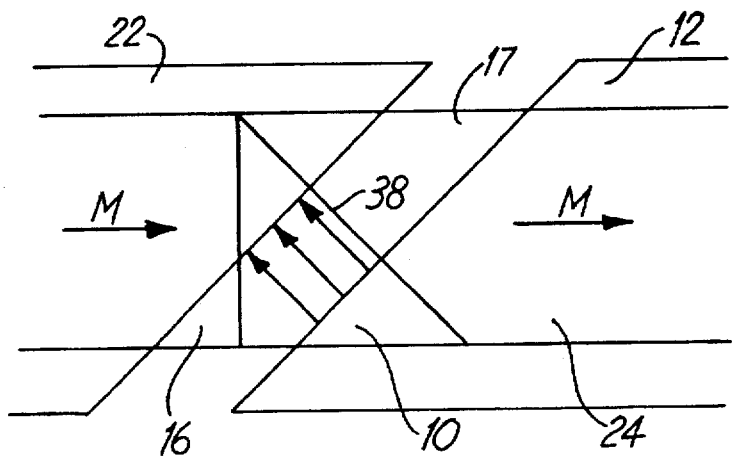
FIG. 8 is a diagram of an alternative embodiment having a triangularly shaped MR element which permits the use of less bias current.

FIG. 8 represents a variation designed to maximize the current efficiency of the sensor. In the figure, the MR element 10 has been configured as a triangle so as to eliminate the inefficient upper right hand portion 17 of the MR element. So configured, all current flowing between the contacts 12 will be favorably angled with respect to the at-rest MR element magnetization vector M. Current flowing in the corresponding portions 17 of rectangular MR elements, such as shown in FIG. 3, operates on less flux than in portions closer to the air bearing surface and further, similar to region 16, has current which flows at angles substantially parallel to M. As a result, the operation of the MR sensor in such a region is highly inefficient.

Due to these considerations, the use of a triangular sensor and high resistivity permanent magnetic layer is expected to reduce overall current by a factor of 2, but also is expected to reduce sensor output only 25%, hence the current efficiency of the sensor is enhanced.

The orientation of the MR element's magnetization M at boundary 38 of the triangular MR element is directed left to right in the figure so that the respective magnetization vectors of the MR element and permanent magnet layers intersect their boundaries at approximately 45°. Even so, because the respective vectors are aligned, flux matching is accomplished using the same amount of permanent magnetic material as with rectangular elements. As a result, the MR element 10 has no unsaturated poles along edge 38 which could lead to domain formation.

Again referring to FIG. 3, the location of the read sensitivity "sweet spot" (area of maximum sensitivity) about which the read sensitivity is nearly symmetrical can be affected by lapping, a process necessary in thin film heads to control the throat height of an MR head's thin film writer and to expose the MR element to the head's air bearing surface so that magnetic flux from the disc's surface may enter the MR element efficiently. For example, in the figure, lapping may extend up from the bottom of the figure to a point 30. This would have no effect on the effective location of the left-hand contacts 12 in the figure, but it would move the initial location of the right hand contact at the ABS to the right in the figure. This movement, in turn, would move the center of the "sweet spot" of the read sensitivity function to the right.

This relative movement of the "sweet spot" causes a problem in aligning the MR element with a thin film writer which is also physically located on the same thin film structure (the writer will typically be formed of thin film layers subsequently formed—see e.g. U.S. Pat. No. 4,967, 298). The location of the "sweet spot" of the one should be accurately controlled with respect to the "sweet spot" of the other. The shifting of the "sweet spot" due to lapping is therefore undesirable.

Figure 9:
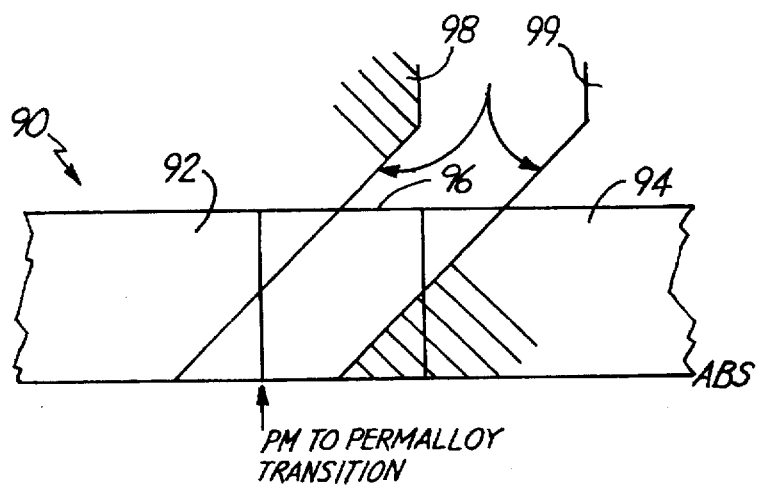
FIG. 9 is a diagram of a magnetoresistive sensor having slanted electrical contacts.
Figure 10:
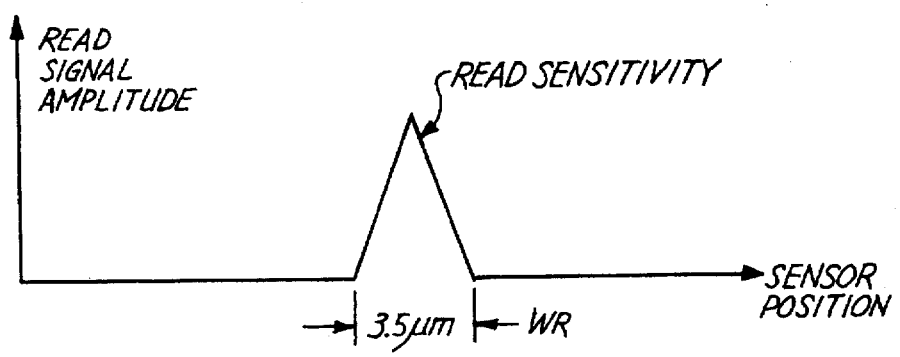
FIG. 10 shows a read sensitivity function for the sensor of FIG. 9.

FIG. 9 shows a magnetoresistive sensor 90 including permanent magnet 92, permanent magnet 94 and permalloy magnetoresistive element 96 positioned between magnets 92 and 94. Sensor 90 includes slanted electrical contact 98 and slanted electrical contact 99. FIG. 9 illustrates a sensor lapped to a desired (nominal) location for the air bearing surface (ABS). The transition between the permanent magnets 92 and 94 and permalloy element 96 along with contacts 98 and 99 determine the shape of the read sensitivity function for sensor 90 which is shown in FIG. 10. Sensor 90 has been lapped to an optimal (nominal) position to achieve a desired read sensitivity function shown in FIG. 10. The width of the read sensitivity function of FIG. 10 is about 3.5 μm. Lapping of sensor 90 causes the right hand boundary between contact 99 and magnetoresistive element 96 to move. On the other hand, the left hand boundary between permanent magnet 92 and magnetoresistive element 96 is lapping insensitive and does not change position during lapping. The position and shape of the read sensitivity function are important because in order to optimize storage, readwidth of the sensor must be optimized to produce maximum position error capability and to provide a linear servo position error signal.

Figure 11:
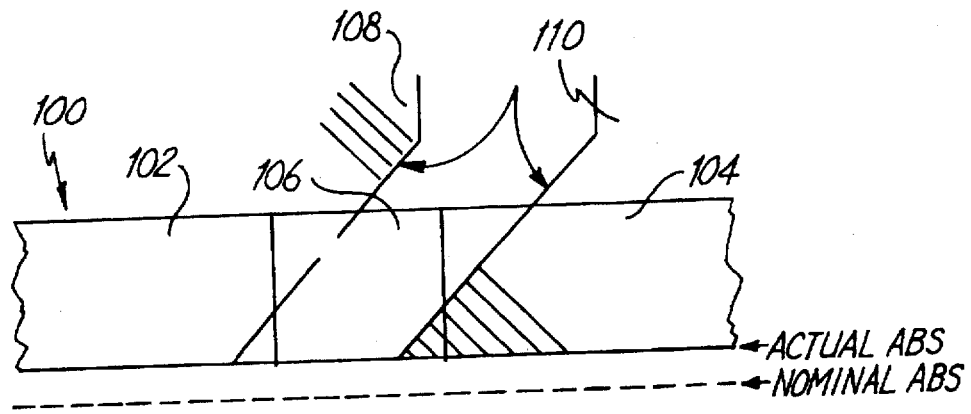
FIG. 11 is a diagram of a magnetoresistive sensor having slanted electrical contacts in which the air bearing surface has been overlapped.
Figure 12:
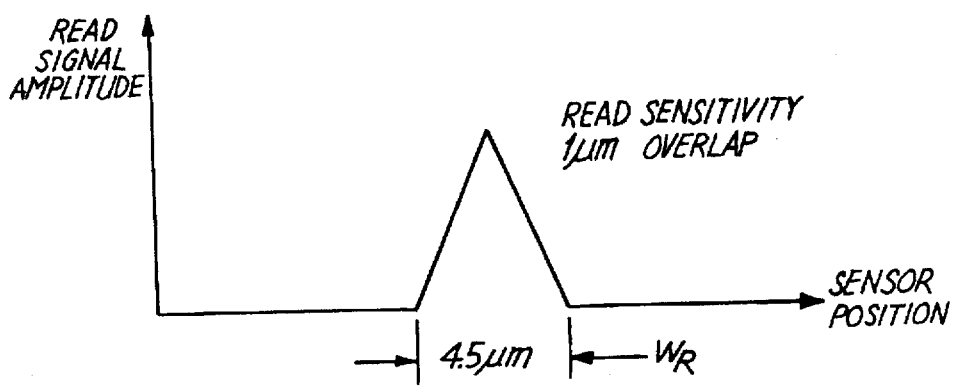
FIG. 12 shows the read sensitivity function for the sensor of FIG. 11.

FIGS. 9 through 14 show the shift in the read sensitivity function due to lapping. FIG. 11 shows a magnetoresistive sensor 100 having permanent magnet 102 and permanent magnet 104. Permalloy magnetoresistive element 106 is positioned between permanent magnets 102 and 104. Slanted electrical contacts 108 and 110 couple to either side of magnetoresistive element 106. FIG. 11 shows the nominal or desired position of the air bearing surface of sensor 100 and the actual position of the air bearing surface following lapping. FIG. 11 shows the condition when lapping has progressed beyond the nominal position of the air bearing surface. The actual lapped position is shown as about 1.0 μm too deep (i.e. overlap). In FIG. 11, the overlapping condition causes offsetting of contacts 108 and 110 relative to magnetoresistive element 106. This offsetting arises because contacts 108 and 110 are slanted. FIG. 12 shows the resulting read sensitivity function.

The difference between the nominal and the actual lapped position causes a lateral shift in the position of the interface between contact 110 and magnetoresistive element 106. In contrast, the left edge of magnetoresistive element 106 defined by the interface between element 106 and permanent magnet 102 remains stationary. This causes the read sensitivity function to shift as illustrated in FIG. 12 relative to the read sensitivity function of FIG. 10. As shown in FIG. 12, the read sensitivity function has shifted and its width has increased to 4.5 μm in comparison with 3.5 μm shown in FIG. 10.

Figure 13:
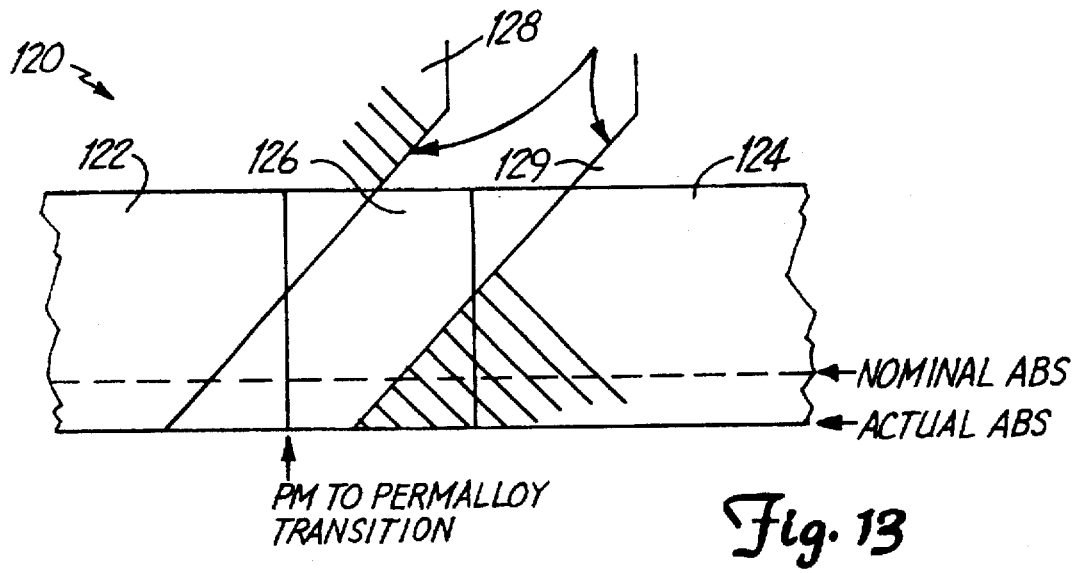
FIG. 13 is a diagram of a magnetoresistive sensor having slanted electrical contacts in which the air bearing surface has been underlapped.

FIG. 13 shows an example of a magnetoresistive sensor 120 having an underlapped condition. Sensor 120 includes permanent magnet 122, permalloy magnetoresistive element 126 and permanent magnet 124. Magnetoresistive element 126 is positioned between magnets 122 and 124. Slanted electrical contacts 128 and 129 are used to couple to magnetoresistive element 126. FIG. 13 shows a nominal or desired air bearing surface and the actual air bearing surface achieved by underlapping sensor 120. The actual position is shown as 1.0 μm short of the desired position (i.e. underlap). This underlapping causes the transition between magnetoresistive element 126 and contact 129 to be moved to the left of FIG. 13 relative to sensor 90 shown in FIG. 9. However, the transition between permanent magnet 122 and magnetoresistive element 126 remains stationary in the underlapped situation in comparison to magnetoresistive sensor 90 in FIG. 9.

Figure 14:
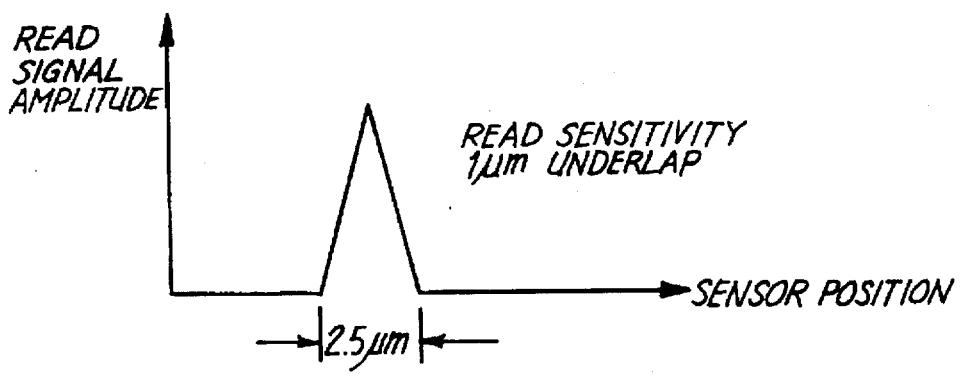
FIG. 14 shows the read sensitivity function for the sensor of FIG. 13.

FIG. 14 shows the resulting read sensitivity function for underlapped magnetoresistive sensor 120 of FIG. 13. In FIG. 14, the width of the read sensitivity function has been reduced to 2.5 μm in comparison with the 3.5 μm shown in FIG. 10. Further, the peak in the read sensitivity function is also shifted due to the underlapping.

Figure 15:
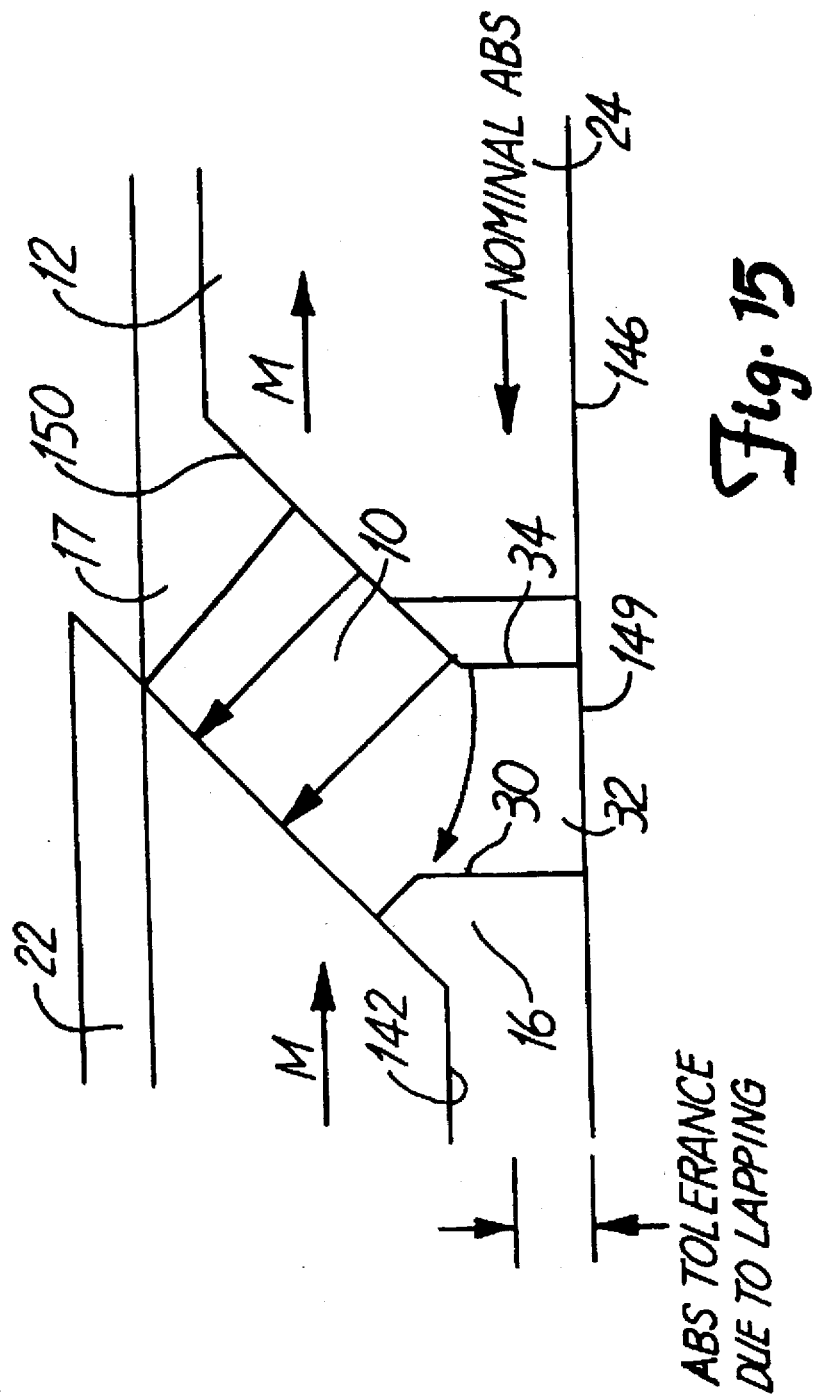
FIG. 15 is a diagram of a further alternative embodiment in which both the sensor and contacts are constructed so as to provide a magnetoresistive sensor with a lip designed to make the read sensitivity function invariant to lapping.

A solution to this lapping-induced "sweet spot" shift problem is illustrated in FIG. 15. In the figure, the MR element is provided with a narrow extension 32, having lateral edge 149 to the unlapped "air bearing surface" (ABS). This extension 32 can be called a "lip". The right hand sense current contact 12 is provided with an elbow located above the highest point 30 of lapping tolerance so as to form a vertically extending contact edge 34 to the unlapped air bearing surface. So constructed, the width of the "lip" provides the effective read width of the MR element, and the contact structure makes the location of the "sweet spot" invariant to lapping. High resistivity permanent magnet material or isolation gaps prevent disadvantageous current from flowing.

Current flowing from the "lip" contact edge 34 tends to flow perpendicularly from the edge. So directed, this current flow will primarily be directed parallel to the MR element's magnetization vector M and thus will provide virtually no component to the sensor's output response to input magnetic flux.

This sensor construction is lapping invariant and also eliminates the inefficient "back portion" 17 of the element as discussed in relation to the triangular element of FIG. 8.

Figure 16:
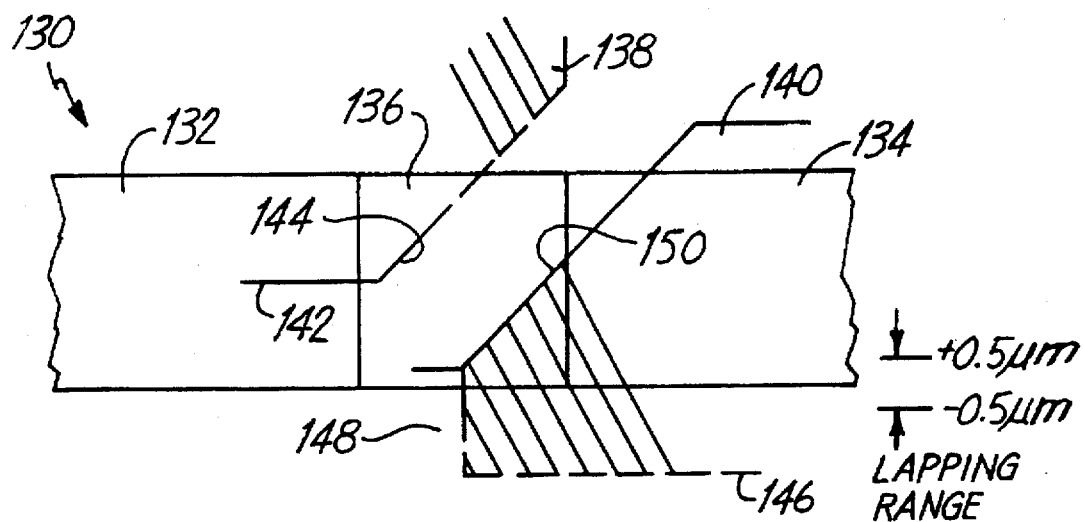
FIG. 16 is a diagram of a magnetoresistive sensor in which the electrical contacts are formed to be lapping insensitive.

FIG. 16 shows another embodiment of the invention to reduce lapping sensitivity. FIG. 16 shows magnetoresistive sensor 130 having a lapping tolerance of ±0.5 μm. Sensor 130 includes permanent magnet 132 and permanent magnet 134 which lie on either side of permalloy magnetoresistive element 136. An electrical contact 138 lies on the left side of FIG. 16 overlying magnetoresistive element 136 and spaced apart in a vertical direction from the air bearing surface of sensor 130. Electrical contact 140 lies to the right side of sensor 130, partially overlying magnetoresistive element 136 and having an edge extending in a lateral direction along the surface of the air bearing surface of sensor 130. In FIG. 16, electrical contact 138 is unique in that it is spaced apart in the vertical direction from the air bearing surface (ABS) of magnetoresistive sensor 130. Contact 138 includes a number of edges, an inner lateral edge 142 and a current directing edge 144. Inner lateral edge 142 extends in a lateral direction parallel with the air bearing surface of sensor 130. Contact 140 also includes a number of edges. An outer lateral edge 146 extends in a lateral direction and is in vertical alignment with the air bearing surface of sensor 130. Contact 140 includes a vertical edge 148 which forms a 90° angle with outer lateral edge 146. A current directing edge 150 of contact 140 extends from vertical edge 148. In the embodiment shown in FIG. 16, the angle between vertical edge 148 and current directing edge 150 is shown to be approximately 135°.

Figure 17:
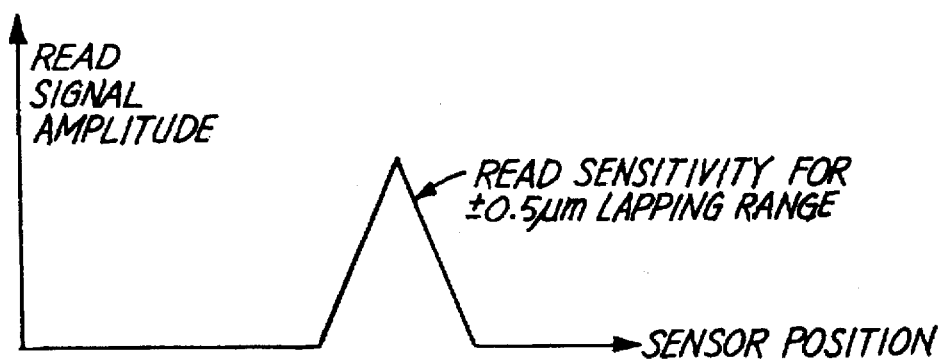
FIG. 17 shows the read sensitivity function of the sensor of FIG. 16.

FIG. 17 shows a read sensitivity function for magnetoresistive sensor 130. The read sensitivity function shown in FIG. 17 remains substantially constant to overlap or underlap of magnetoresistive sensor 130 from the nominal lapping position. In the embodiment shown, the read sensitivity function is largely stable over a ±0.5 μm lapping range. This range is within typical lapping tolerances of processing techniques used in fabricating magnetoresistive sensor 130.

Note that in the embodiment shown in FIG. 16, the bias angle of the current traveling through magnetoresistive element 136 between contacts 138 and 140 has been maintained by altering the shape of both the right contact (contact 140) and the left contact (contact 138). Inner lateral edge 142 helps maintain a symmetry about a diagonal line between contacts 138 and 140.

Figure 18:
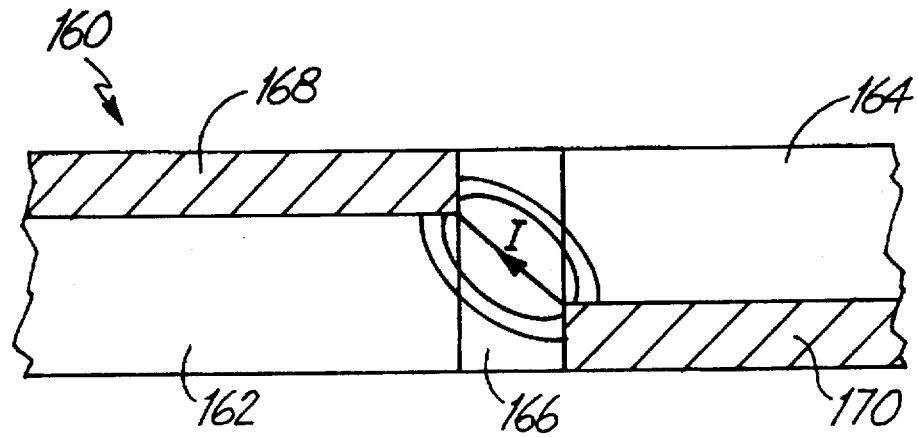
FIG. 18 shows a variation on the design of FIG. 16 where the modification to the shape of the electrical contacts is taken further away from a slanted electrical contact.

FIG. 18 shows a magnetoresistive element 160 having a more extreme variation from the basic design 0f FIG. 16. Sensor 160 includes permanent magnets 162 and 164 positioned on either side of permalloy magnetoresistive element 166. Electrical contacts 168 and 170 couple to magnetoresistive element 166 and are used to read back information.

Figure 19:
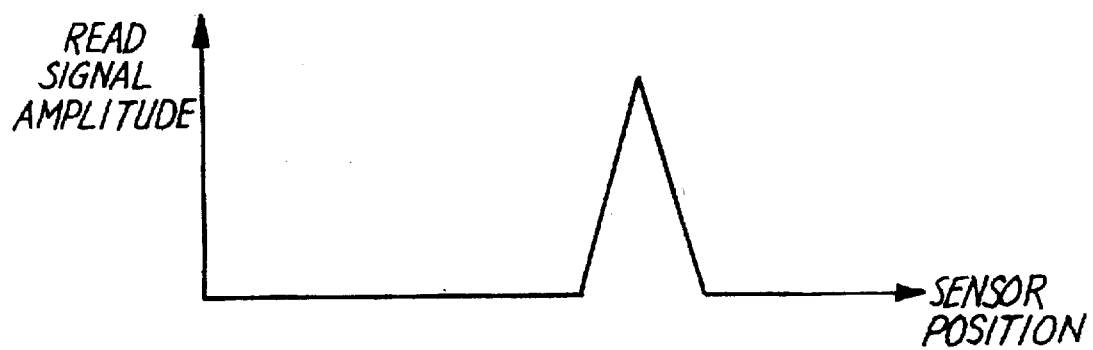
FIG. 19 shows a read sensitivity function for the magnetoresistive sensor of FIG. 18.

Contacts 168 and 170 shown in FIG. 18 are straight rather than slanted, in comparison with sensor 130 shown in FIG. 16. FIG. 18 includes lines extending between contact 170 and contact 168 which illustrate the direction of sense current between the two contacts and through the magnetoresistive element 166. The 45° biasing of the current is provided by staggering contact 168 and contact 170, and through the current confinement due to the higher resistivity of permanent magnets 162 and 164 relative to magnetoresistive element 166. FIG. 19 shows the read sensitivity function for magnetoresistive sensor 160. The read sensitivity function shown in FIG. 19 is relatively constant up until lapping has removed so much from contact 170 as to make it ineffective.

Contact 168 includes an inner lateral edge and a current directing edge. In FIG. 18, the angle between inner lateral edge and current directing edge of contact 168 is shown to be 90°. Similarly, contact 170 includes an outer lateral edge and a vertical edge. The angle between the vertical edge and the outer lateral edge of contact 170 is shown to be 90°. Contact 170 also includes a current directing edge which is effectively an inner lateral edge. The angle between the vertical edge and the inner lateral edge of contact 170 is shown to be 90°.

Figure 20:
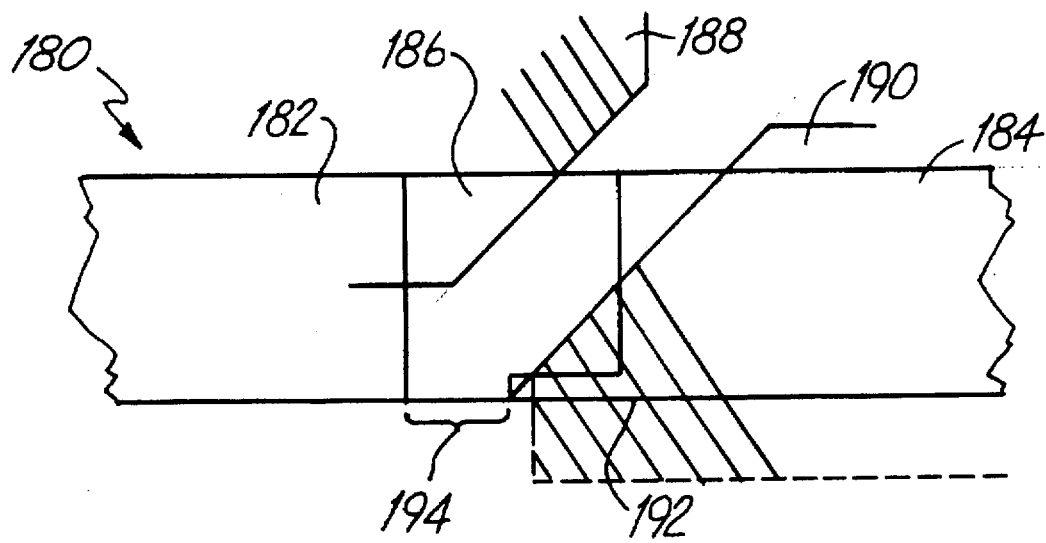
FIG. 20 shows a variation on the present invention including a lip portion formed in the magnetoresistive element.

FIG. 20 shows another embodiment of a magnetoresistive sensor 180, in accordance with the invention. Magnetoresistive sensor 180 includes permanent magnet 182 and permanent magnet 184 which lie on either side of permalloy magnetoresistive element 186. Sensor 180 includes contacts 188 and 190. Contacts 188 and 190 are similar to contacts 138 and 140 shown in FIG. 16. In FIG. 20, permanent magnet 184 includes an extension 192 which forms a lip 194 in the magnetoresistive element 186. Contact 188 includes a lateral edge and a current directing edge similar to contact 138 shown in FIG. 16. Further, contact 190 includes an outer lateral edge, a vertical edge and a current directing edge similar to contact 140 of FIG. 16.

Figure 21:
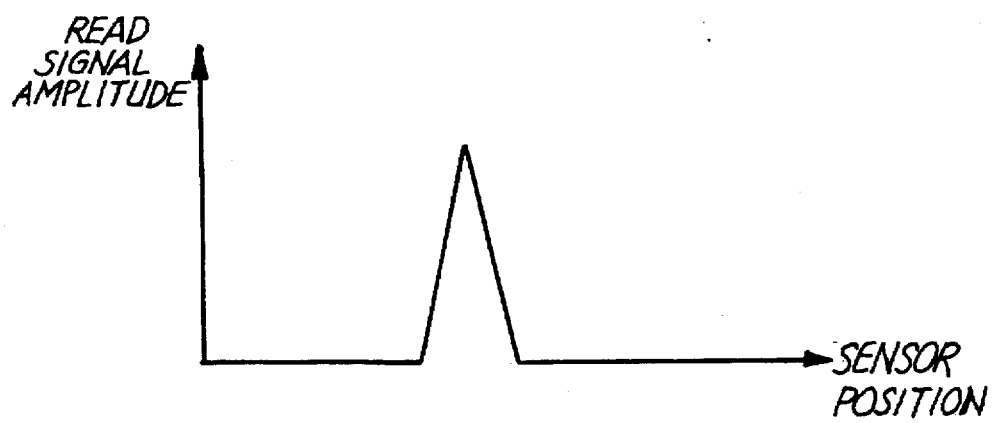
FIG. 21 shows a read sensitivity function for the magnetoresistive sensor of FIG. 20.

The combination of the shape of contacts 188 and 190 and lip 194 provide the read sensitivity function shown in FIG. 21. The design shown in FIG. 21 is desirable because it reduces the effect of horizontal misalignment on the read sensitivity function due to misalignment between the contacts and the magnetoresistive element. The right side of the read sensitivity function shown in FIG. 21 is determined by the interface between permanent magnet 184 and magnetoresistive element 186. Similarly, the left side of the read sensitivity function is determined by the position of the interface between permanent magnet 182 and magnetoresistive element 186. As the air bearing surface of sensor 180 is lapped in a vertical direction, the position of these interfaces remains relatively constant providing the relatively lapping insensitive read sensitivity function shown in FIG. 21. For the magnetoresistive sensor 180 shown in FIG. 21, misalignment to the left of 0.5 μm causes a very slight change in the right hand side of the read sensitivity function shown in FIG. 21 because flux propagating under contact 190 occurs up until the point where the right hand side is cut off by the boundary of lip 194. The lip is stabilized by the permanent magnets 184 and 182, and therefore is a single domain and acts like a flux guide having a fixed width.

FIGS. 22, 23, 24 and 25 show a series of steps used in forming a magnetoresistive sensor in accordance with the present invention. It has been discovered that alignment between the various layers in a magnetoresistive sensor (for example the electrical contacts, the permanent magnet and the permalloy) is significant in forming a controllable read sensitivity function. The reason for this sensitivity to alignment is that the left and right read boundaries are typically determined by different layer levels: the left boundary by the interface between the permanent magnet and the permalloy, and the right boundary by the slanted electrical contact. The sensitivity to lapping arises from the lateral motion due to lapping and can be reduced by redesigning the sensors so that this lateral motion is eliminated. More specifically, FIGS. 22 through 25 show a self-aligned deposition technique which helps reduce this misalignment.

Figure 22:
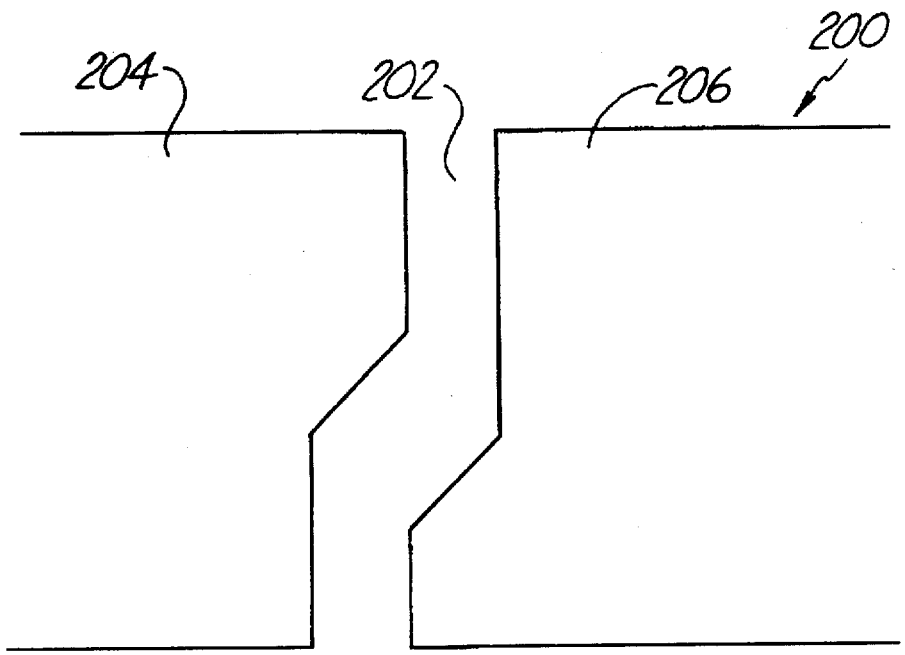
FIG. 22 is a plan view of a step in forming a magnetoresistive sensor in accordance with the invention.

FIG. 22 is a plan view of a substrate 200 in which a permalloy layer has been deposited across the entire surface of the substrate. Next a mask is applied (for example, photoresist) and using lift-off techniques the undesired portion of the permalloy is removed leaving permalloy magnetoresistive element 202. With the same mask, the permanent magnet layer is deposited. In a preferred embodiment, the permanent magnet is from CoPt or CoCrPt. Next, using the same mask, the electrical contact is deposited having the same shape as the permanent magnet. In a preferred embodiment, the electrical contact is MoAuMo. In FIG. 22, the permanent magnet/electrical contact layers are identified as 204 and 206.

Figure 23:
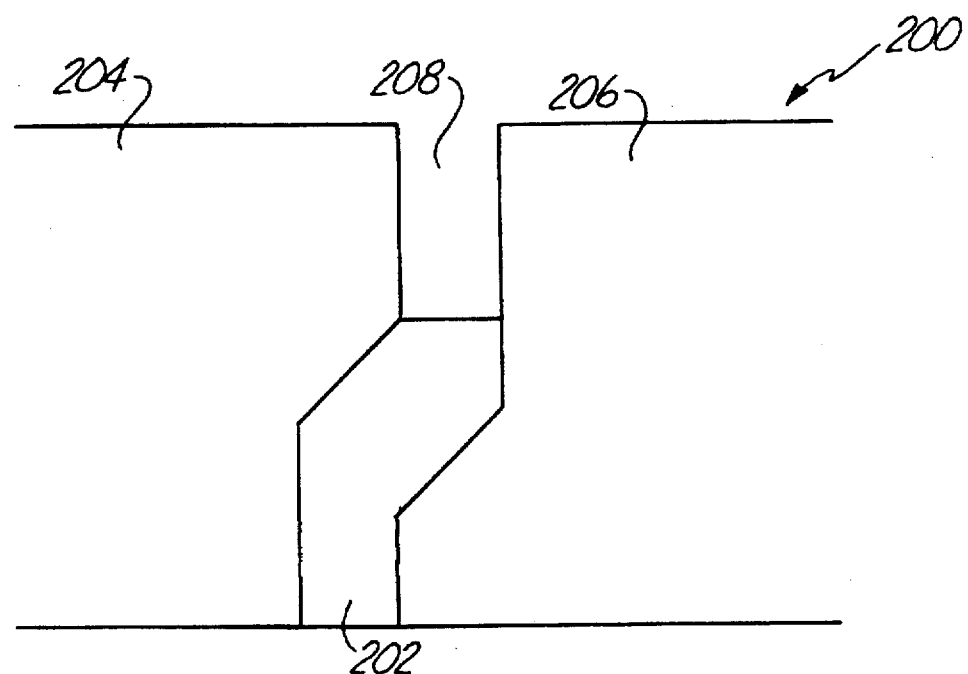
FIG. 23 is a subsequent step showing fabrication of a magnetoresistive sensor in accordance with the present invention.

FIG. 23 shows a subsequent step in the formation of substrate 200 into a magnetoresistive sensor in accordance with the invention. In FIG. 23, a portion identified as 208 of magnetoresistive element 202 has been removed. This step defines the height of magnetoresistive element 202 and is through a subsequent masking and etching step.

Figure 24:
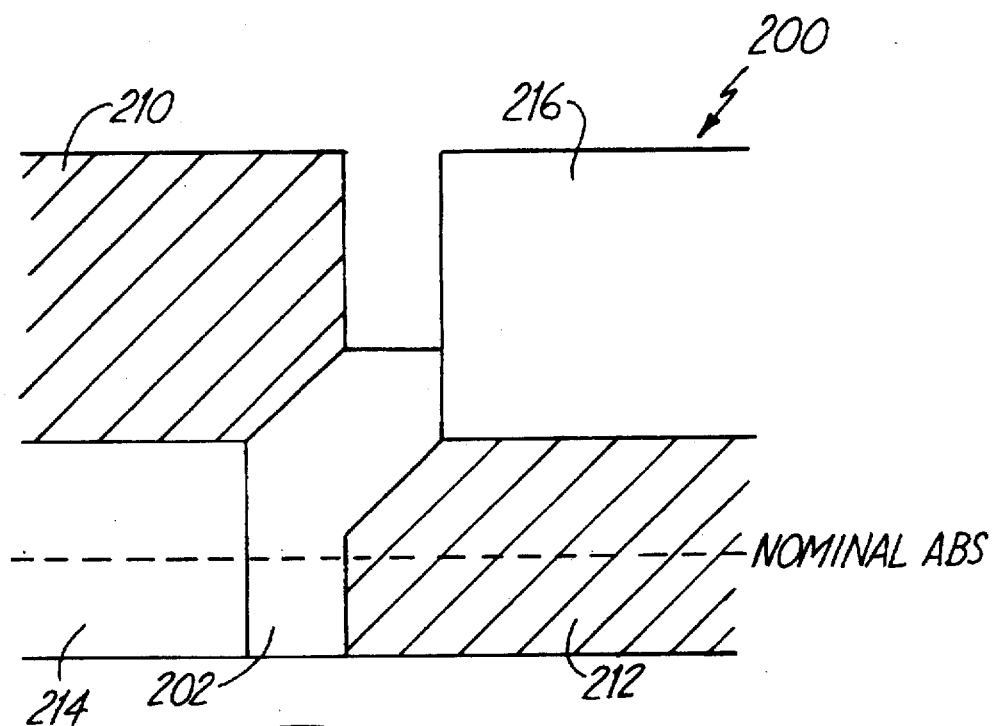
FIG. 24 is a subsequent step showing fabrication of a magnetoresistive sensor in accordance with the present invention.

FIG. 24 shows a subsequent step in the formation of substrate 200 into a magnetoresistive sensor in accordance with the invention. In FIG. 24, a portion of the electrical contact layer has been removed. This is through a subsequent masking and etching step. In one embodiment, the etching step is a plasma-therm etching step. FIG. 24 shows electrical contacts 210 and 212. These are formed by etching away a portion of the MoAuMo electrical contact layers shown in FIG. 23 which reveal the underlying permanent magnet layers 214 and 216. FIG. 24 also shows the nominal position of the air bearing surface (ABS).

Figure 25:
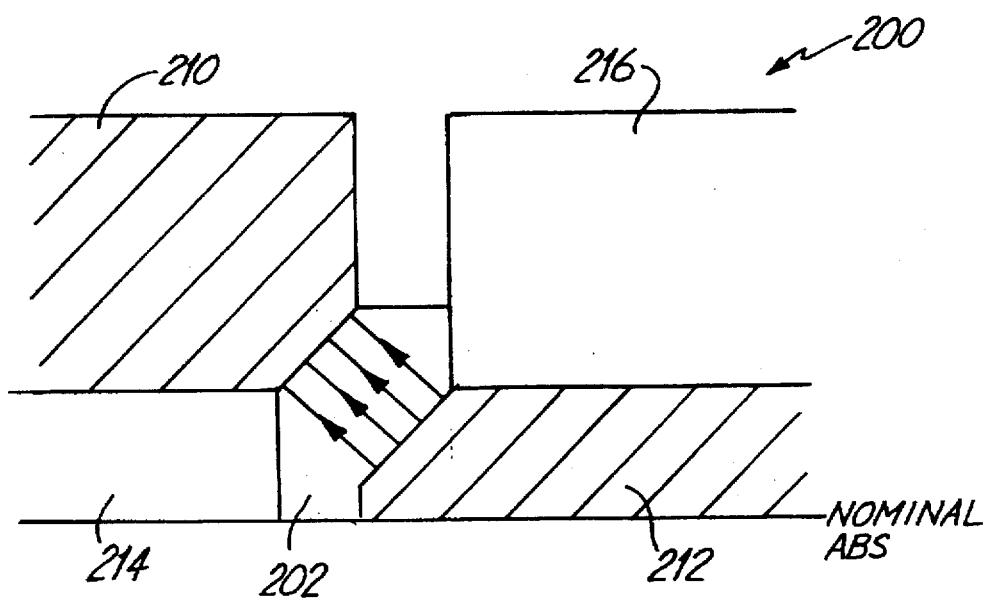
FIG. 25 is a subsequent step showing fabrication of a magnetoresistive sensor in accordance with the present invention.

FIG. 25 shows substrate 200 following lapping to reach the nominal air bearing surface. FIG. 25 also shows the current vectors in the active magnetoresistive element 202. The lip of magnetoresistive element 202 can be made small enough so that it has little influence on amplitude of the read sensitivity function, typically lapping tolerance being 0.5 μm. The resulting structure shown in FIG. 25 does not have any "hot spots" and utilizes current flowing through magnetoresistive element 202 very efficiently. Because the structure is self-aligned, the various sensitivities to lapping discussed above are not present. The read sensitivity function is symmetrical and triangular. The structure provides a very uniform current density through the magnetoresistive element, and improved biasing. The design is very tolerant to misalignment.

A combination of the variations shown in FIGS. 16 through 25 (variations in contacts, geometry and limited width flux input using a lip in the magnetoresistive element) can be used to improve the read sensitivity function variability.

FIG. 26 shows a modification to the basic design which eliminates the inefficient "back portion" of the element but which does not have a "lip."

FIGS. 27 and 28 show a fundamentally different variation. Here the rectangular MR element is rotated approximately 45° and is provided with a "lip" 32. Contacts are applied "squared up" to the ABS rather than slanted as in the original design. Permanent magnetic layers 22 and 24 are provided along the upper left and bottom right edges of the "diamond." All these layers are patterned during manufacture with their magnetization vector M directed parallel to the ABS, i.e., left to right in the figure. However, due to induced magnetic "charges" of opposite polarity being produced by the permanent magnetic layers at opposite edges, the magnetization vector M of the MR element in the central region rotates so that it is directed between these edges, downward at 45° in the figure. Note however, that the magnetization vector M of the "lip" remains directed parallel to the ABS. This is due to both the different geometry of the lip and because the magnetization at element edges tends to align itself parallel to the ABS edge.

In the figure, the "lip" is provided with a separate stabilization permanent magnetic layer 40. However, as suggested by FIG. 28, this is a design choice. The "lip" may also be stabilized by extension of the "active region" stabilization layer 22.

Because the permanent magnetic layer and MR element magnetization vectors are not directed in the same direction, the amount of permanent magnetic layer necessary to stabilize the domain structure of the MR element without introducing a longitudinal biasing field must be adjusted. The adjustment is made by multiplying the amount necessary when the vectors are aligned according to the following formula; wherein for a given boundary the permanent magnetic material has a magnetization of $M_1$ and a thickness of $t_1$, and the MR element has a magnetization $M_2$ and a thickness $t_2$, and the angles between $M_1$ and $M_2$ and the boundary are $theta_1$ and $theta_2$ respectively, the amount of permanent magnetic material is chosen such that $$M_1 * t_1 * \sin(theta_1) = M_2 * t_2 * \sin(theta_2).$$

This sensor configuration has two fundamental advantages. First, the sense current contacts may be "squared up" so that they are lapping invariant and still provide a linearized output because sense current I and at-rest magnetization M will be oriented at approximately 45°. Second, the sensor has a "lip" which does not "read" at all, but instead acts as a pure flux guide.

FIG. 29 illustrates a variation of this approach wherein the MR element 10 is patterned so that the "left hand" permanent magnetic layer 22 is formed such that the intersecting boundary between the layer 22 and the MR element 10 is direct parallel the MR head's ABS. As illustrated in this figure, the magnetization vectors M of the permanent magnetic layers are initially aligned in the same direction as the preferred MR element magnetization layer, downward to the right at 45°. Also, the leftmost sense contact 12 can be configured so that sense current I flows only in the substantially rectangular area just above the "lip" as indicated. So configured, the read sensitivity function compares favorably to MR sensors with external transverse biasing—but without the loss in sensitivity caused by the transverse biasing field.

This sensor configuration requires that there be no permanent magnetic stabilization along the left edge of the lip area 32. Stabilization of this edge may instead be accomplished by spacing the sensor's soft magnetic shields close to the MR element at the ABS. Soft magnetic film layers are illustrated in FIG. 7a at 62 and in the above incorporated '035 patent. See layers 15 of FIG. 1 or 23 of FIG. 3a.

Figure 30:
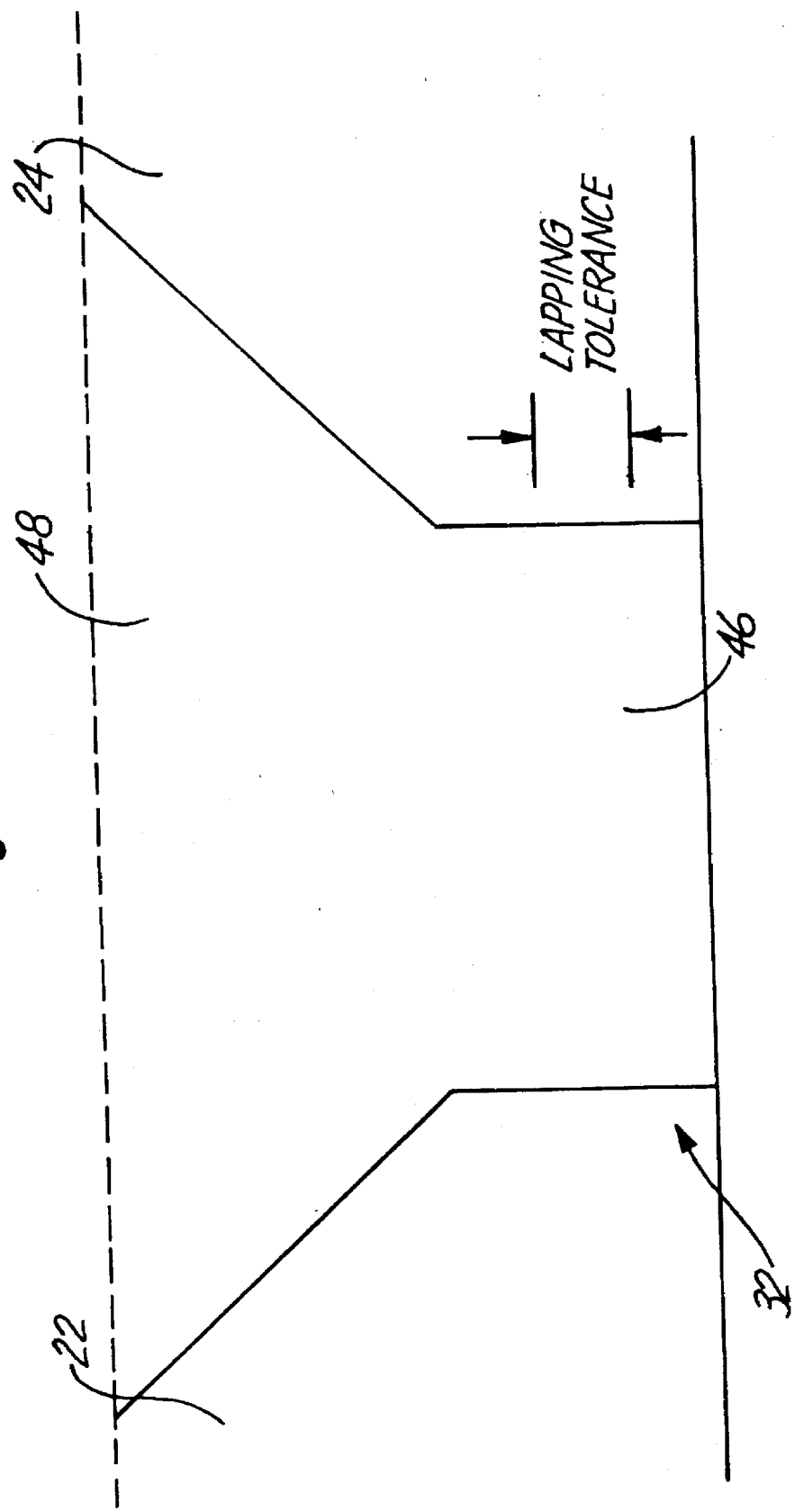
FIG. 30 is a diagram of a preferred lip structure with an expanded rear region to provide flux for a wider sensor than that determined by the lip width at the air bearing surface.

Referring back to FIG. 27, which illustrates a "diamond" MR element 10, the "lip" structure can be described as a lapping intolerant "neck" section, connected to a "flux expanding" section, which is in turn connected to the active sense region where current I flows in the MR element between the contacts 12. This lip construction is better illustrated in FIG. 30.

In this figure, the lip neck region is at reference 46 and the expander region is at reference 48.

This structure is a preferred lip structure with respect to all previously described "lip" embodiments. Although the flux density out of the lip is less than that in, the total sensor output can be increased by virtue of a larger area of interaction with the sensor's sense current. As a result, the read width of the MR sensor can be independently adjusted from the width of the active area so that each may be separately optimized.

Figure 31:
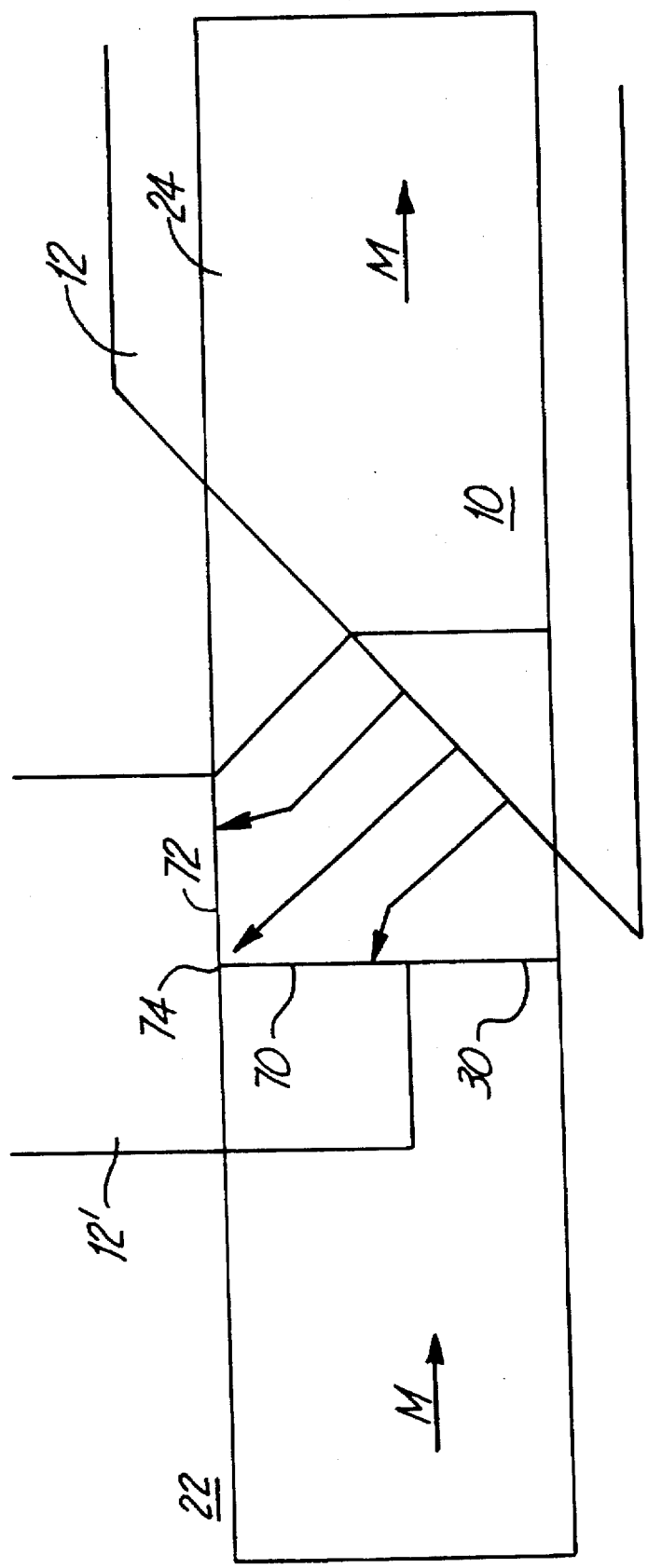
FIG. 31 is a diagram of an alternative embodiment illustrating a hybrid contact structure which yields improved read sensitivity symmetry.

FIG. 31 illustrates a variation on the sensor structure illustrated in either FIGS. 9 or 22. In this variation, contact 12' is not canted as is contact 12, but rather is "squared up." The sensor in this configuration yields a more highly symmetrical read sensitivity function than designs with a slanted left contact.

In the figure, the left contact has two approximately orthogonal edges 70 and 72 interfacing with the MR element 10 at a vertex 74 approximately centered on the center of the current from the canted contact 12. One edge 70 is also approximately orthogonal to the air bearing surface defined by lapping up in the figure to point 30.

Although the present invention has been described with reference to preferred embodiments, workers skilled in the art will recognize that changes may be made in form and detail without departing from the spirit and scope of the invention.

What is claimed is:

1. A method of making a magnetoresistive sensor, comprising:

depositing a magnetoresistive element on a substrate, the magnetoresistive element having a magnetization vector and a lateral edge parallel to the magnetization vector extending in a lateral direction;

patterning a first electrical contact adjacent and electrically coupling to the magnetoresistive element, the electrical contact including an inner lateral edge extending in a lateral direction and spaced apart in a vertical direction from the lateral edge of the magnetoresistive element;

patterning a second electrical contact adjacent and electrically coupling to the magnetoresistive element and spaced apart in a lateral direction from the first electrical contact, such that the second electrical contact includes an outer lateral edge extending in the lateral direction and substantially colinear with the lateral edge of the magnetoresistive element, the second electrical contact including a vertical edge adjacent the outer lateral edge and proximal the first electrical contact; and lapping the lateral edge of the second electrical contact along the vertical edge to form an air bearing surface wherein the vertical edge of the second electrical contact remains stationary relative to the magnetoresistive element and the first electrical contact during lapping to form a magnetoresistive sensor.

2. The method of claim 1 wherein the vertical edge and the outer lateral edge form an angle of about 90°.

3. The method of claim 1 wherein the shape of the first and second electrical contacts is such that lapping the second electrical contact along the vertical edge within a predetermined tolerance range does not cause lateral movement of the second electrical contact with respect to the magnetoresistive element.

4. The method of claim 1 wherein an inner lateral edge of the first electrical contact is parallel with the outer lateral edge of the second electrical contact.

5. The method of claim 1 wherein the first contact includes a vertical edge forming an angle of about 90° with the inner lateral edge.

6. The method of claim 1 wherein the first contact includes a current directing edge forming an angle of about 135° with the inner lateral edge.

7. The method of claim 1 wherein the the outer lateral edge of the second electrical contact forms an angle of about 90° with the vertical edge.

8. The method of claim 1 wherein the second electrical contact includes a current directing edge forming an angle of about 135° with the vertical edge.

9. The method of claim 1 wherein the magnetoresistive element includes a lip defining a limited region of flux input to the magnetoresistive element.

10. The method of claim 1 wherein the magnetoresistive element includes corners having an angle of about 90°.

11. A method for making a magnetoresistive sensor, comprising:

depositing a magnetoresistive element on a substrate, the magnetoresistive element having a magnetization vector and a lateral edge parallel to the magnetization vector extending in a lateral direction;

patterning a first electrical contact adjacent and electrically coupling to the magnetoresistive element, such that the electrical contact includes an inner lateral edge extending in a lateral direction and spaced apart in a vertical direction from the lateral edge of the magnetoresistive element;

patterning a second electrical contact adjacent and electrically coupling to the magnetoresistive element and spaced apart in a lateral direction from the first electrical contact, such that the second electrical contact includes an outer lateral edge extending in the lateral direction and substantially colinear with the lateral edge of the magnetoresistive element, the second electrical contact including a vertical edge adjacent the outer lateral edge proximal the first electrical contact; and lapping the lateral edge of the second electrical contact along the vertical edge form an air bearing surface, wherein the vertical edge remains stationary relative to the magnetoresistive element during lapping, thereby forming the magnetoresistive sensor.

12. The method of claim 11 wherein the vertical edge and the outer lateral edge form an angle of about 90°.

13. The method of claim 11 wherein the shape of the first and second electrical contacts is such that lapping the second electrical contact along the vertical edge within a predetermined tolerance range does not cause lateral movement of the second electrical contact with respect to the magnetoresistive element.

14. The method of claim 11 wherein the inner lateral edge of the first electrical contact is parallel with the outer lateral edge of the second electrical contact.

15. The method of claim 11 wherein the first contact includes a vertical edge forming an angle of about 90° with the inner lateral edge.

16. The method of claim 11 wherein the first contact includes a current directing edge forming an angle of about 135° with the inner lateral edge.

17. The method of claim 11 wherein the outer lateral edge of the second electrical contact forms an angle of about 90° with the vertical edge.

18. The method of claim 11 wherein the second electrical contact includes a current directing edge forming an angle of about 135° with the vertical edge.

19. The method of claim 11 wherein the magnetoresistive element includes a lip defining a limited region of flux input to the magnetoresistive element.

20. The method of claim 11 wherein the magnetoresistive element includes corners having an angle of about 90°.

21. A method of making a magnetoresistive sensor, comprising:

depositing a magnetoresistive element on a substrate, the magnetoresistive element having a magnetization vector;

patterning the magnetoresistive element to form a lip having a lateral edge;

depositing and patterning a first electrical contact proximate and electrically coupling to the magnetoresistive element and remote from the lateral edge;

depositing a second electrical contact proximate and electrically coupling to the magnetoresistive element, spaced apart from the first electrical contact and proximate the lateral edge wherein the magnetization vector crosses the magnetoresistive element from the second electrical contact to the first electrical contact;

patterning an elbow in the second electrical contact wherein the elbow includes a vertical edge adjacent to a second edge, and wherein the vertical edge is substantially perpendicular to the lateral edge of the magnetoresistive element; and lapping the lateral edge of the magnetoresistive element and the second electrical contact along the vertical edge to form an air bearing surface wherein the vertical edge of the second electrical contact remains stationary relative the magnetoresistive element and the first electrical contact during lapping.

22. The method of claim 21 wherein the vertical edge and an inner later edge form an angle of approximately 90°.

23. The method of claim 22 wherein the first electrical contact includes a third edge adjacent a fourth edge, wherein the third edge is substantially perpendicular to the lateral edge.

24. The method of claim 23 wherein the fourth edge is perpendicular to the third edge.

25. The method of claim 21 wherein the vertical edge and the second edge form an angle of approximately 135°.

26. The method of claim 21 and further comprising depositing and patterning an extension to the first electrical contact proximate the lateral edge and having a fifth edge generally perpendicular to the lateral edge and spaced apart from the second electrical contact, and wherein the step of lapping includes lapping the extension to the first electrical contact.

* * * * *

UNITED STATES PATENT AND TRADEMARK OFFICE
CERTIFICATE OF CORRECTION

PATENT NO. : 5,669,133
DATED : September 23, 1997
INVENTOR(S) : Peter K. George

It is certified that error appears in the above-indentified patent and that said Letters Patent is hereby corrected as shown below:

```
Col. 13, line 56, after "vertical edge" insert
--to--.
```

Signed and Sealed this

Seventeenth Day of March, 1998

Attest:

BRUCE LEHMAN

Attesting Officer

Commissioner of Patents and Trademarks